United States Patent
Wang et al.

(10) Patent No.: US 12,128,377 B2
(45) Date of Patent: Oct. 29, 2024

(54) SYSTEM AND METHOD FOR INTEGRATION OF BIOLOGICAL CHIPS

(71) Applicant: MGI Tech Co., Ltd., Shenzhen (CN)

(72) Inventors: Liang Wang, Newark, CA (US); Jian Gong, Danville, CA (US); Yan-You Lin, Fremont, CA (US); Shifeng Li, Fremont, CA (US)

(73) Assignee: MGI Tech Co., Ltd., Shenzhen (CN)

( * ) Notice: Subject to any disclaimer, the term of this patent is extended or adjusted under 35 U.S.C. 154(b) by 792 days.

(21) Appl. No.: 17/297,923

(22) PCT Filed: Nov. 27, 2019

(86) PCT No.: PCT/CN2019/121226
§ 371 (c)(1),
(2) Date: May 27, 2021

(87) PCT Pub. No.: WO2020/108519
PCT Pub. Date: Jun. 4, 2020

(65) Prior Publication Data
US 2022/0040662 A1    Feb. 10, 2022

Related U.S. Application Data

(60) Provisional application No. 62/772,477, filed on Nov. 28, 2018.

(51) Int. Cl.
*B01J 19/00* (2006.01)
*B01L 3/00* (2006.01)
*H01L 23/00* (2006.01)

(52) U.S. Cl.
CPC ..... *B01J 19/0046* (2013.01); *B01L 3/502707* (2013.01); *B01L 3/502715* (2013.01); *H01L 24/32* (2013.01); *H01L 24/83* (2013.01); *H01L 24/95* (2013.01); *B01J 2219/00529* (2013.01); *B01J 2219/00662* (2013.01); *B01L 2300/0819* (2013.01); *H01L 24/73* (2013.01); *H01L 2224/32059* (2013.01); *H01L 2224/32137* (2013.01); *H01L 2224/32155* (2013.01); *H01L 2224/32225* (2013.01); *H01L 2224/73204* (2013.01); *H01L 2224/73215* (2013.01); *H01L 2224/73265* (2013.01); *H01L 2224/83005* (2013.01); *H01L 2224/83136* (2013.01); *H01L 2224/83191* (2013.01); *H01L 2224/83192* (2013.01); *H01L 2224/83951* (2013.01)

(58) Field of Classification Search
CPC .................................................. B01J 19/0046
See application file for complete search history.

(56) References Cited

U.S. PATENT DOCUMENTS

| | | | |
|---|---|---|---|
| 4,907,062 A | 3/1990 | Fukushima | |
| 6,352,881 B1 | 3/2002 | Nguyen et al. | |
| 6,548,895 B1 * | 4/2003 | Benavides | H01L 23/4334 |
| | | | 257/784 |
| 2003/0138819 A1 | 7/2003 | Gong et al. | |
| 2006/0057580 A1 | 3/2006 | Zou et al. | |
| 2008/0280785 A1 | 11/2008 | Tseng et al. | |
| 2009/0273075 A1 | 11/2009 | Meyer-Berg | |
| 2012/0091594 A1 * | 4/2012 | Landesberger | H01L 24/83 |
| | | | 257/E23.068 |

FOREIGN PATENT DOCUMENTS

| | | |
|---|---|---|
| CN | 1343790 A | 4/2002 |
| CN | 101086009 A | 12/2007 |
| CN | 101582396 A | 11/2009 |
| CN | 102113089 A | 6/2011 |
| CN | 102369432 A | 3/2012 |
| CN | 107369656 A * | 11/2017 |
| DE | 10336513 A1 | 3/2005 |
| DE | 102007020475 * | 6/2008 |
| JP | 2019536981 A * | 12/2019 |

OTHER PUBLICATIONS

Google translation—CN107369656A (Changxin Memory Technologies Inc) (Year: 2017).*
Google translation—DE102007020475 (Janesch et al.) (Year: 2008).*
Google translation—JP2019536981A (Year: 2019).*
Taiwanese Application No. 108143275, Office Action mailed on May 10, 2023, 5 pages. Translation of Substantive Objections on p. 5.
PCT/CN2019/121226 , "International Search Report and Written Opinion", Mar. 9, 2020, 8 pages.

* cited by examiner

*Primary Examiner* — Brian Gangle
*Assistant Examiner* — Lakia J Jackson-Tongue
(74) *Attorney, Agent, or Firm* — Kilpatrick Townsend & Stockton LLP

(57) ABSTRACT

An apparatus (100) including multiple biological chips (110,120) includes a substrate (101), a first adhesive layer (134) disposed on the substrate (101), a first biological chip (110) and a second biological chip (120) disposed on the first adhesive layer (134) and attached to the substrate (101) by the adhesive layer (134). The apparatus (100) further includes a filler (130) disposed between the first biological chip (110) and the second biological chip (120). The filler (130) includes a second adhesive layer (135) extending between a side surface (114) of the first biological chip (110) and a side surface (124) of the second biological chip (120), the second adhesive layer (135) attaching the first biological chip (110) to the second biological chip (120). The filler (130) also includes a surface layer (132) disposed over the second adhesive layer (135). The surface layer (132) has a hydrophobic surface that is co-planar with a top surface (111) of the first biological chip (110) and a top surface (121) of the second biological chip (120).

19 Claims, 12 Drawing Sheets

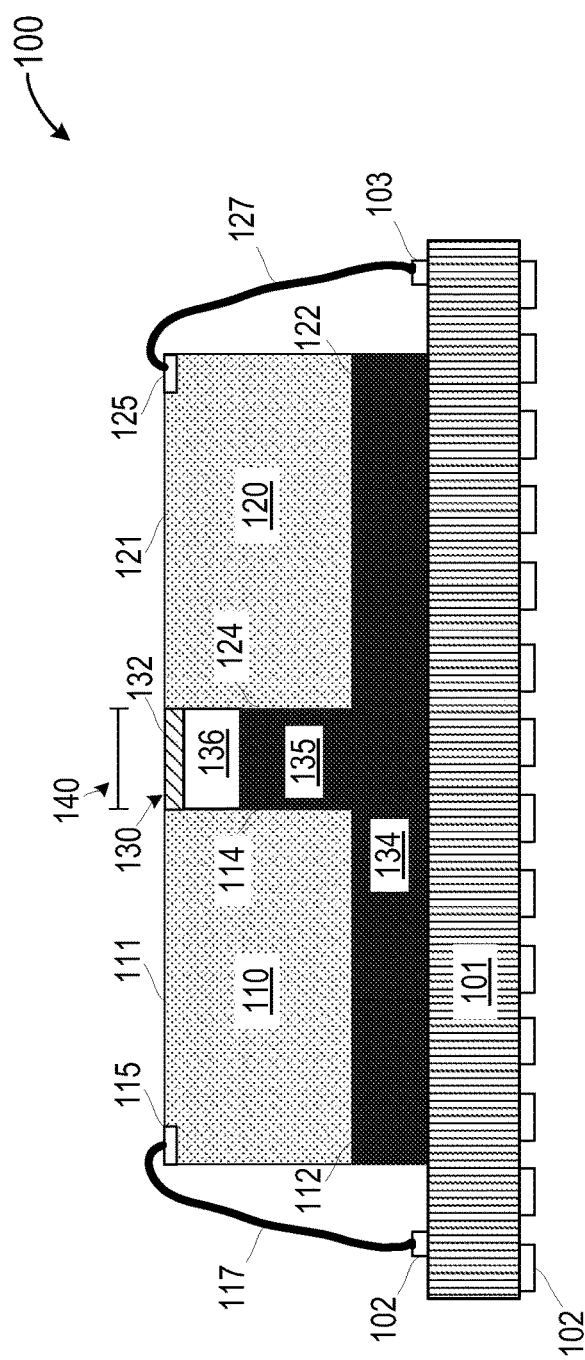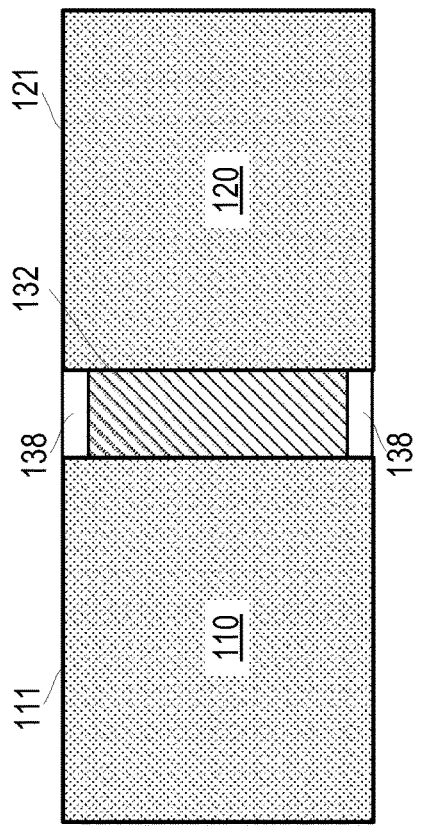
FIG. 1
FIG. 2

SYSTEM AND METHOD FOR INTEGRATION OF BIOLOGICAL CHIPS

CROSS-REFERENCES TO RELATED APPLICATIONS

This application claims priority to and is a 371 application of PCT Application No. PCT/CN2019/121226, filed Nov. 27, 2019, which claims benefit of U.S. Provisional Patent Application No. 62/772,477, filed Nov. 28, 2018, entitled "System And Method For Integration Of Biological Chips," which is commonly assigned and incorporated by reference in their entirety herein for all purposes.

FIELD

The present invention relates generally to systems and methods for integrating multiple biological chips on a substrate for forming a microfluidic apparatus.

BACKGROUND OF THE INVENTION

High-throughput analysis of chemical and/or biological species is an important tool in the fields of diagnostics and therapeutics. Arrays of attached chemical and/or biological species can be designed to define specific target sequences, analyze gene expression patterns, identify specific allelic variations, determine copy number of DNA sequences, and identify, on a genome-wide basis, binding sites for proteins (e.g., transcription factors and other regulatory molecules). In a specific example, the advent of the human genome project required that improved methods for sequencing nucleic acids, such as DNA (deoxyribonucleic acid) and RNA (ribonucleic acid), be developed. Determination of the entire 3,000,000,000 base sequence of the haploid human genome has provided a foundation for identifying the genetic basis of numerous diseases.

High-throughput analyses, such as massively parallel DNA sequencing, often utilize flow cells, which contain arrays of chemicals and/or biological species available for analysis. Flow cells are often made with a microfluidic housing integrated with a biological chip, for example, a silicon-based sensor chip, to form a microfluidic apparatus. An integrated lab-on-a-chip can include sensing and micro droplets handling functions. The manufacture and use of many current microfluidic designs can be complicated and costly, and are often unreliable.

BRIEF SUMMARY OF THE INVENTION

Embodiments of the invention provide methods and apparatus for integrating multiple biological chips on a substrate in a microfluidic apparatus. Using multiple chips can combine chips for different functions or having multiple similar chips to increase throughput. Existing microfluidic apparatus tend to use a single large integrated chip, either to perform multiple functions or to provide higher capacity. However, a single chip of large die area tends to have poor yield, increasing the cost of the system. In embodiments of the invention, multiple known-good-die (KGD) chips are combined on a substrate to form a microfluidic apparatus. The methods and structures for integrating multiple biological chips on a substrate can lead to cost-effective microfluidic apparatus. Moreover, such low-cost devices can be used as disposable devices.

In some embodiments of the invention, the filling material between adjacent chips can include a hydrophobic surface layer for providing compatibility to the microfluidic operation and an underlying adhesive layer for bonding the adjacent chips and provide mechanical strength.

According to some embodiments of the invention, an apparatus having multiple biological chips includes a substrate, a first adhesive layer disposed on the substrate, a first biological chip and a second biological chip disposed on the first adhesive layer and attached to the substrate by the adhesive layer. The apparatus further includes a filler disposed between the first biological chip and the second biological chip. The filler includes a second adhesive layer extending between a side surface of the first biological chip and a side surface of the second biological chip, the second adhesive layer attaching the first biological chip to the second biological chip. The filler also includes a surface layer disposed over the second adhesive layer. The surface layer has a hydrophobic surface that is co-planar with a top surface of the first biological chip and a top surface of the second biological chip.

In some embodiments of the above apparatus, the surface layer in the filler can include a mold release material. In alternative embodiments, the surface layer in the filler can include a titanium material. In other embodiments, the surface layer in the filler can include a poly(p-xylylene) polymer.

In some embodiments, the first adhesive layer can include an epoxy adhesive. In some embodiments, the first adhesive layer can include a die attach adhesive. In some embodiments, the second adhesive layer comprises an epoxy adhesive. In some embodiments, the second adhesive layer includes a portion of the first adhesive layer extending between the side surface of the first biological chip and the side surface of the second biological chip.

In some embodiments, the apparatus can also include an intermediate layer between the second adhesive layer and the surface layer. For example, the intermediate layer comprises a sealant.

In some embodiments, the first biological chip can be a biosensor chip, and the second biological chip is a fluidic droplets manipulating chip. In some embodiments, both the first and second biological chips can be biosensor chips. In some embodiments, the substrate is a printed circuit board (PCB).

According to some embodiments of the invention, an apparatus includes a printed circuit board (PCB) having a cavity, and the PCB has a top surface and a bottom surface. A biological chip is disposed in the cavity. The biological chip has a top surface and a bottom surface, and the top surface of the biological chip is coplanar with the top surface of the PCB. The apparatus has a filler disposed between the biological chip and the PCB. The filler includes an adhesive layer disposed between a side surface of the biological chip and a side surface of the PCB, and the adhesive layer attaches the biological chip to the PCB. The filler also includes a surface layer is disposed over the adhesive layer and being co-planar to a top surface of the biological chip and a top surface of the PCB, the surface layer having a hydrophobic surface.

Depending on the embodiments, the surface layer in the filler can include a mold release material, a titanium material, or a poly(p-xylylene) polymer, and the like. The adhesive layer can include an epoxy adhesive.

In some embodiments, the cavity in the PCB extends partially through the PCB and exposes a surface of the PCB at the bottom of the cavity. In these embodiments, a bottom surface of the biological chip is electrically coupled, by solder balls, to a surface of the PCB at the bottom of the cavity.

In some embodiments, the cavity in the PCB is a through hole that extends from the top surface of the PCB to the bottom surface of the PCB. In this case, a bottom surface of the biological chip is electrically coupled to a bottom surface of the PCB by wire bonds.

According to some embodiments, a method is provided for forming an apparatus having multiple biological chips. The method includes providing a substrate, disposing an adhesive layer on the substrate, and disposing a first biological chip and a second biological chip the adhesive layer on the substrate, with the first biological chip and the second biological chip spaced apart by a gap. The method also includes forming a filler in the gap between the first biological chip and the second biological chip. The filler includes a portion of the adhesive layer extending between a side surface of the first biological chip and a side surface of the second biological chip. The adhesive layer attaching the first biological chip to the second biological chip. The filler also includes a surface layer disposed over the adhesive layer. The surface layer has a hydrophobic surface that is co-planar with a top surface of the first biological chip and a top surface of the second biological chip.

Depending on the embodiments of the above method, the surface layer in the filler can include a mold release material, a titanium material, or a poly(p-xylylene) polymer, and the like. The adhesive layer can include an epoxy adhesive. The adhesive layer can include an epoxy adhesive. In some embodiments, the substrate is a printed circuit board (PCB).

In some embodiments of the above method, the process of forming the filler can includes attaching the first biological chip and the second biological chip to the substrate using the adhesive layer, with the first biological chip and the second biological chip spaced apart by a gap, and a portion of the adhesive layer filling a lower portion of the gap between the first biological chip and the second biological chip. The process can also include forming a hydrophobic surface layer in the gap, such that a top surface of the hydrophobic surface layer is coplanar with a top surface of the first biological chip and a top surface of the second biological chip.

In some embodiments of the above method, the filler further can include an intermediate layer between the surface layer and the adhesive layer. In some embodiments, the intermediate layer comprises a sealant.

According to alternative embodiments, a method for forming an apparatus having multiple biological chips can include providing a first substrate, providing a first biological chip having a front surface and a back surface, and providing a second biological chip having a front surface and a back surface. The method can include disposing the first biological chip and the second biological chip face down on the first substrate, with the front surfaces of the first and second biological chips facing the first substrate, and the first biological chip and the second biological chip spaced apart by a gap that exposes a surface of the first substrate. The method can also include forming a filler in the gap between the first biological chip and the second biological chip. The filler includes a surface layer and an adhesive layer. The surface layer is disposed between the front surface of the first biological chip and the front surface of the second biological chip. The adhesive layer is disposed above the surface layer and between a side surface of the first biological chip and a side surface of the second biological chip. Further, the adhesive layer extends to the back surface of the first biological chip and the back side of the second biological chip. The method also includes attaching a second substrate to the adhesive layer on the back surfaces of the first and second biological chips, and removing the first substrate to form a multiple-chip structure. The multiple-chip structure includes the first and second biological chips attached to the second substrate, with the gap between the first and second biological chips covered with the surface layer in the filler. The surface layer has a hydrophobic surface that is co-planar with a top surface of the first biological chip and a top surface of the second biological chip.

In some embodiments of the above method, forming the filler in the gap includes forming the surface layer covering the surface of the first substrate and sidewalls of the gap at a bottom portion of the gap between the first biological chip and the second biological chip. It also includes forming the adhesive layer above the surface layer, and coving the bottom surface of the first biological chip and the back surface of the second biological chip.

In some embodiments, the surface layer in the filler includes a mold release material, and the method includes spraying a mold release through a stencil into the gap between the first biological chip and the second biological chip to form the surface layer.

In some embodiments, the surface layer in the filler comprises a titanium material, and the method includes sputtering the titanium material through a stencil into the gap between the first biological chip and the second biological chip to form the surface layer.

In some embodiments, the surface layer in the filler includes a poly(p-xylylene) polymer, and the method includes spraying the poly(p-xylylene) polymer through a stencil into the gap between the first biological chip and the second biological chip to form the surface layer.

In some embodiments, the adhesive layer comprises an epoxy adhesive. In some embodiments, the method also includes forming an intermediate layer over the adhesive layer and fill in a middle portion of the gap.

In some embodiments, the first substrate is a vacuum stage, and the second substrate is a printed circuit board (PCB).

A further understanding of the nature and advantages of the present invention may be realized by reference to the remaining portions of the specification and the drawings.

BRIEF DESCRIPTION OF THE DRAWINGS

FIG. 1 is a simplified cross-sectional view diagram illustrating an apparatus including multiple biological chips according to some embodiments of the present invention;

FIG. 2 is a top-view diagram illustrating the multiple-biological chip apparatus of FIG. 1 according to some embodiments of the present invention;

FIG. 4A is a cross-sectional view diagram illustrating a printed circuit board (PCB) that can be used in the method of FIG. 2;

FIG. 4B is a cross-sectional view diagram illustrating an adhesive and a stencil disposed above a printed circuit board (PCB) that can be used the method of FIG. 2;

FIG. 4C is a cross-sectional view diagram illustrating biological chips attached to a printed circuit board (PCB) that can be used in the method of FIG. 2;

FIG. 4D is a cross-sectional view diagram illustrating the structure of FIG. 4C after the stencil is removed;

FIG. 4E is a cross-sectional view diagram illustrating an intermediate layer formed in the gap between biological chips;

FIG. 4F is a cross-sectional view diagram illustrating a top surface layer formed in the gap between biological chips;

FIG. 4G is a top view diagram illustrating two biological chips and a top surface layer formed in the gap between biological chips;

FIG. 6A is a cross-sectional view diagram illustrating a first substrate that can be used in the method of FIG. 5.

FIG. 6B is a cross-sectional view diagram illustrating a first biological chip and a second biological chip attached to the first substrate in the method of FIG. 5.

FIG. 6C is a cross-sectional view diagram illustrating a surface layer formed in the gap between the biological chips in the method of FIG. 5.

FIG. 6D is a cross-sectional view diagram illustrating an intermediate layer in the gap between biological chips and on the back side of the biological chips;

FIG. 6E is a cross-sectional view diagram illustrating an adhesive layer in the gap between biological chips and on the back side of the biological chips;

FIG. 6F is a cross-sectional view diagram illustrating a second substrate attached to the back of the biological chips using the adhesive layer;

FIG. 6G is a cross-sectional view diagram illustrating the first substrate removed from the biological chips in the structure of FIG. 6E;

FIG. 6H is a top view diagram illustrating two biological chips disposed on the second substrate with a filler between the biological chips in the method of 500 in FIG. 5;

DETAILED DESCRIPTION OF THE INVENTION

Figure 3:
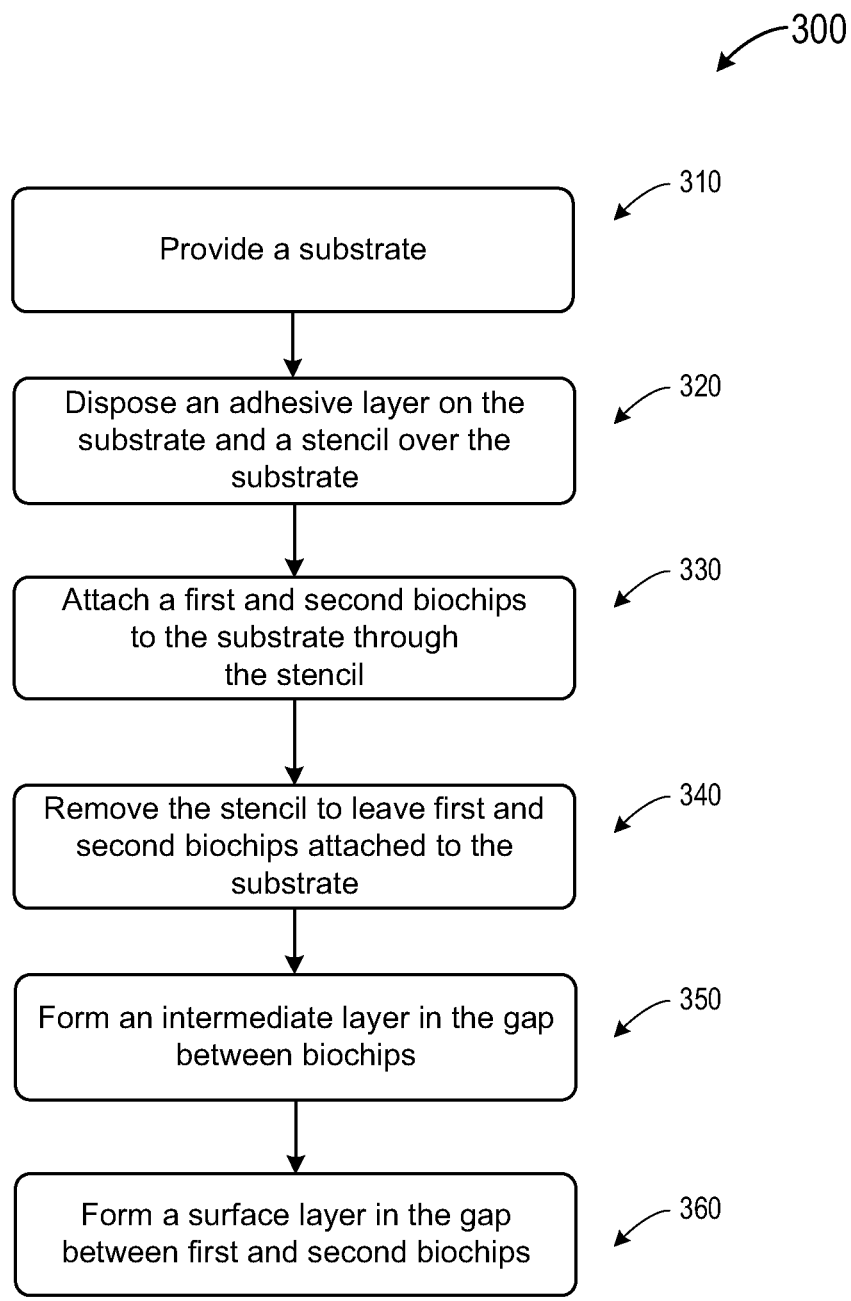
FIG. 3 is a flowchart illustrating a method for forming a multiple-biological chip apparatus according to some embodiments of the present invention.

In a microfluidic apparatus, it is desirable to have multiple chips in the same package. For example, one of the biological chips can be a sensor for detecting signals from biological patterns, and another biological chip can be a device controlling generation and manipulation of fluidic droplets. Integration of multiple biological chips that provide different functions can allow the realization of miniaturized bio-detection platforms. The microfluidic apparatus can also include multiple sensors or droplet manipulation devices to increase throughput. For this purpose, the multiple-chip package is more desirable than fabricating a single large chip with higher capacity, because of the drop in yield in large chips.

In some embodiments of the invention, the filler material between adjacent chips can include a hydrophobic layer (closer to the surface of the multiple chips) and an underlying layer. In some embodiments, the hydrophobic layer can be deposited by various methods, such as PVD (physical vapor deposition), CVD (chemical vapor deposition), ALD (atomic layer deposition), spray, or printing processes, and the like. The underlying layer can include an epoxy adhesive. The substrate for the multiple biological chips can be based on silicon, glass, ceramic, printed circuit board (PCB), and the like.

Embodiments of the invention provide filling processes and materials that are solids at operation cycles, provide good adhesion to the chips (e.g., silicon-based chips), and form a filler structure that is co-planar with the multiple chips. For example, the co-planarity can be within less than 10% of the minimum of geometry in XY plane of the device structure. Further, the filler structures are resistant to aqueous fluids used in the microfluidic apparatus. In some embodiments, the filler structure can sustain fluid pressure of at least 5 PSI during the operation of the microfluidic apparatus. In some embodiments, the filler structure has a hydrophobic surface to facilitate aqueous fluid flow during the operation of the microfluidic apparatus. Such structures can facilitate smooth fluid control between digital fluidic devices and sensors.

As used herein, the term "biocompatible material" or "compatible material" refers to materials that have properties suitable to be used in a biological device as described above. For example, it is desirable that the compatible material is a solid during operation cycles, can provide good adhesion to the chips, is resistant to aqueous fluids, can enable smooth aqueous fluid flow, and can sustain fluid pressure during operation of the biological device. In some embodiments, a hydrophobic material is used as the filler material to facilitate fluid flow.

Various combinations of devices can be combined with the filler structure. For example, multiple sensors, a single digital fluid device to a single sensor, a single digital fluid device to multiple sensors, multiple digital fluid devices to a single sensor, multiple digital fluid devices to multiple sensors, etc., can be integrated into a biological apparatus with multiple known-good-die (KGD) sensors instead of using a single die of large area but poor yield. Embodiments of the invention provide cost-effective packaging methods and structures that can be used as disposable apparatus.

In some embodiments, the width of the gap or spacing between adjacent chips can be less than 5 mm. In some embodiments, the spacing can be less than 1 mm. In some embodiments, the spacing can be less than 200 µm. In some embodiments, the spacing can be less than 50 µm. In some embodiments, the multiple chips or devices can be joined on sidewall by the filler structure. In some embodiments, a small device can be placed into a cavity of a larger device. The larger device can have multiple cavities. Further, the multiple devices can be joined on sidewall and in cavities. The cavity can be in cuboid shape, trapezoid shape, or stepwise. In some devices, the bottom surface of the device(s) can be patterned with electrode(s) carrying signal or power. In other devices, electrode(s) can be absent on the bottom surface of said device(s). Alternatively, the top surface of said device(s) can be patterned with electrode(s) carrying signal or power. In other embodiments, electrode(s) can be absent on the top side of said device(s).

FIG. 1 is a simplified cross-sectional view diagram illustrating an apparatus including multiple biological chips according to some embodiments of the present invention. As shown in FIG. 1, apparatus 100 includes a substrate 101. A first biological chip 110 and a second biological chip 120 are attached to the substrate with a first adhesive layer 134, with the first biological chip and the second biological chip spaced apart by a gap 140. The first biological chip 110 has a front surface (also referred to as a top surface) 111 and a back (or bottom) surface 112. The second biological chip 120 has a front surface (also referred to as a top surface) 121 and a back (or bottom) surface 122. Apparatus 100 also includes a filler 130 disposed in the gap 140 between the first biological chip 110 and the second biological chip 120. The filler can have a first layer 132 and a second layer 135. The first layer 132 is disposed between the top surface 111 of the first biological chip 110 and the top surface 121 of the second biological chip 120. The first layer 132 is configured to be compatible with biological samples and reagents disposed on the first biological chip and the second biological chip. In some embodiments, the first layer 132 is hydrophobic. The second layer 135 is disposed under the first layer 132. The second layer 135 is disposed between a side wall 114 of the first biological chip 110 to a side wall 124 of the second biological chip 120. The second layer 135 is configured to provide adhesion between the first biological chip 110 and the second biological chip 120 and to provide mechanical strength of the apparatus. There can also be an intermediate layer 136 between the first layer 132 and the second layer 135.

In some embodiments, the second adhesive layer 135 can be a portion of the first adhesive layer 134 extending into the gap 140. In this case, the first adhesive layer 134 and the second adhesive layer 135 can be formed in the same process step, as explained below. In some embodiments, the second adhesive layer 135 can be formed separately from the first adhesive layer 134. The width of the gap between sidewalls of first and second biological chips can be selected according to the application. For example, the gap can be less than 500 micrometers.

In some embodiments, the biological chips can be connected to the substrate 101 using a wire bonding method. As shown in FIG. 1, the biological chip 110 is electrically connected to substrate 101 by bonding wire 117, which connects bond pad 102 on the substrate 101 to bond pad 115 on biological chip 110. Similarly, the biological chip 120 is electrically connected to substrate 101 by bonding wire 127, which connects bond pad 103 on the PCB 101 to bond pad 125 on biological chip 120. In some embodiments, the substrate 101 can be a printed circuit board (PCB).

The biological chips 110 and 120 can include devices that handle or analyze biological or chemical samples. As used herein, a "biological chip" refers to a structure with which a biological molecule(s) associate(s), is immobilized, or is captured, for analysis. Typically a biological chip is manufactured from a semiconductor, such as silicon. and has a substantially planar surface and a plurality of features on a the surface. Exemplary features include wells, derivatized discrete spaced apart regions separated by a chemically or biologically inert surface, or the like. The features may be arranged in a regular pattern such as, for illustration only, in rows and or columns. Typically, a biological chip comprises an array of binding sites, where each binding site can be independently occupied by a biological molecule such as a protein, nucleic acid, antibody, polysaccharide, or the like. Typically, detectable signals generated at one or many binding sites can be detected. For example, an enzymatic, binding, or chemical reaction at one binding site may produce a detectable signal, such as a fluorescent or chemiluminescent emission, which is detected and identifies a feature or characteristic of the biological molecule at that site. As described herein below, biological chips may be used for nucleic acid sequencing. In some cases the biological chip can include a sensor (i.e., a biological sensor). As used herein, the term "biosensor" or "biological sensor" may be used to refer to an apparatus for determining a light emitting substance within or attached to a biological molecule, particularly a nucleic acid macromolecule exemplified by DNA and branched or otherwise derivatized nucleic acids. In an example, a biological chip can detect a signal, such as a fluorescent or chemiluminescent signal, from a biological sample, and a processor can process the detected signal and respond to the signal by triggering an actuator. Examples of biological chips can include CMOS biological sensors described in U.S. patent application Ser. No. 16/128, 120, filed Sep. 11, 2018, which is herein incorporated by reference in its entirety. For instance, a biological sensor can include flow cells overlying a complementary metal-oxide-semiconductor (CMOS) layer. The CMOS layer can include a photo sensing layer having a plurality of photodiodes, and an electronic circuit layer coupled to the photo sensing layer for processing sensed signals. Other examples of biological chips can also include micro droplets handling chips, such as the integrated lab-on-a-chip cartridge described in U.S. patent application Ser. No. 12/513,157, filed Nov. 1, 2007, U.S. Pat. Published App. No. 20100096266, published Apr. 22, 2010, which is herein incorporated by reference in its entirety. It will be appreciated that the microfluidic apparatus described herein can be used to detect signal-producing events not related to biological reactions (e.g., a signal produced by a chemical transformation not involving a biological molecule). That is, the terms "biological chip," "biosensor," and "biological sensor" refer to the common use of the apparatuses for analysis of biological molecules (e.g., nucleic acid analysis or sequencing) but is not intended to be limiting.

In some embodiments, the first biological chip can be a biosensor chip, and the second biological chip can be a fluidic droplets manipulating chip. In other embodiments, both the first and second biological chips can be biosensor chips.

FIG. 2 is a top-view diagram illustrating the multiple-biological chip apparatus of FIG. 1 according to some embodiments of the present invention. FIG. 2 shows the top surface 111 of the first biological chip 110 and the top surface 121 of the second biological chip 120. FIG. 2 also shows a top surface of the first layer 132 of filler 130. In some embodiments, the first layer material is removed at the edges 138 of the first layer 132. As described above, in some embodiments, the first layer 132 is hydrophobic and serves as an interface between the first biological chip 110 and the second biological chip 120. However, a hydrophobic surface may not compatible with bonding of a microfluidic housing to form a flow cell. Therefore, the hydrophobic material is removed at the edges to accommodate bond lines.

In some embodiments, the first biological chip can be a detection chip, and the second biological chip can be a controlling chip. In some embodiments, the first biological chip can be a biosensor chip, and the second biological chip can be a droplet manipulating chip. In some embodiments, both the first and second biological chips can be biosensor chips.

As described above, the first layer 132 is configured to be compatible with biological samples and reagents disposed on the first biological chip and the second biological chip. In some embodiments, the first layer 132 has a hydrophobic surface.

FIG. 3 is a flowchart illustrating a method for forming a multiple-chip apparatus according to some embodiments of the present invention. FIGS. 4A-4G are cross-sectional view diagrams illustrating the method summarized in the flowchart of FIG. 3 according to some embodiments of the present invention. The method for forming a multiple-chip apparatus, such as the multiple-biological chip apparatus 100 of FIG. 1 is now described with reference to the flowchart of FIG. 3 and the cross-sectional view diagrams in FIGS. 4A-4G.

As shown in FIG. 3, method 300 for forming a multiple-biological chip apparatus can be summarized as follows.
  At 310—Provide a substrate;
  At 320—Dispose an adhesive layer on the substrate and a stencil over the adhesive layer;
  At 330—Attach a first biological chip and a second biological chip to the substrate through the stencil;
  At 340—Remove the stencil to leave first biological chip and second biological chip attached to the substrate;
  At 350—Form an intermediate layer in the gap between biological chips (optional); and
  At 360—Form a top layer in the gap between the first and second biological chips.
These processes are described in more detail below.

Figure 4A:
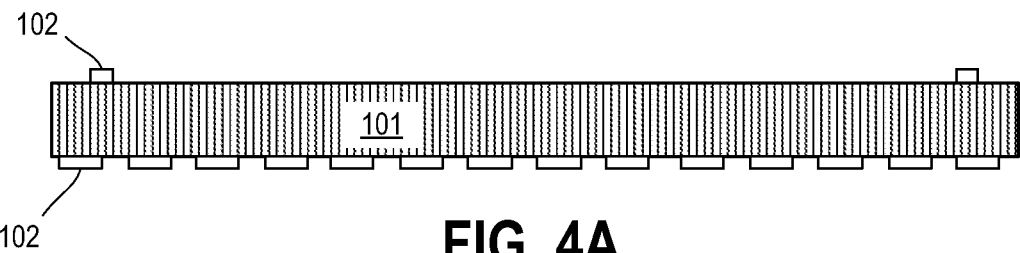
FIGS. 4A-4G are cross-sectional view diagrams illustrating the method summarized in the flowchart of FIG. 2 according to some embodiments of the present invention.

In process 310, the method 300 starts with providing a substrate. In some embodiments, the substrate can be a printed circuit board (PCB). For example, FIG. 4A shows a printed circuit board (PCB) 101, which is an example of a substrate that can be used in the method 300 of FIG. 3. The PCB can include bonding pads for making electrical connections with the electronic components on the circuit board and for making electrical connections with external components. For example, FIG. 3A shows bonding pads 102. Other substrates can also be used for the multiple biological, for example, silicon, other semiconductors, glass, ceramic, and the like.

At process 320, the method 300 includes disposing an adhesive on the substrate and disposing a stencil over the substrate. For example, in FIG. 4B, an adhesive layer 134 is disposed on the PCB 101, which is an example of the substrate. In some embodiments, the adhesive layer 134 can be an epoxy adhesive. Epoxy adhesives are made of epoxy resins, also known as polyepoxides, which are a class of reactive prepolymers and polymers which contain epoxide groups.

Alternatively, the adhesive layer 134 can be a die attach film (DAF) used for attaching a semiconductor die to a substrate. The die attach film can include materials such as an epoxy resin, a phenol resin, acrylic rubber, silica filler, or a combination thereof, and may be applied using a lamination technique. An example of a die attach adhesive is ABLEBOND® 789-3™, made by Henkel Chemicals Company, Dusseldorf, Germany. However, any other suitable alternative materials and formation techniques may alternatively be used.

Figure 4B:
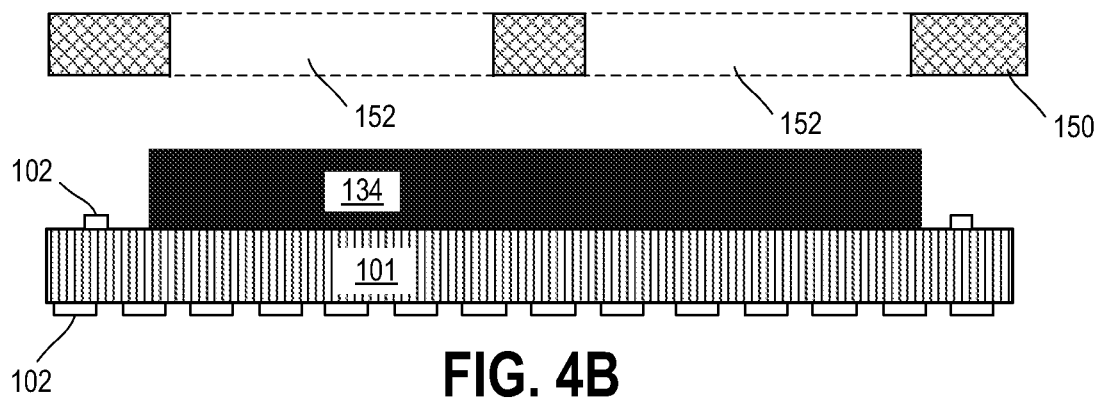

Process 320 also includes disposing a stencil over the substrate. For example, FIG. 4B illustrates a stencil 150 disposed over the PCB 101 and adhesive 134. As used herein, a stencil refers to a thin sheet of material, such as plastic or metal, with a pattern cut out of it, used to guide in the placement of chips onto a substrate, such as a PCB, or to allow materials to be formed on selected regions of the substrate. The stencil can be disposed on the substrate or supported above the substrate by a support structure. As shown in FIG. 4B, openings 152 mark the positions for biological chips to be disposed on an adhesive layer 134, which can be a die attach film, on the PCB 101.

Figure 4C:
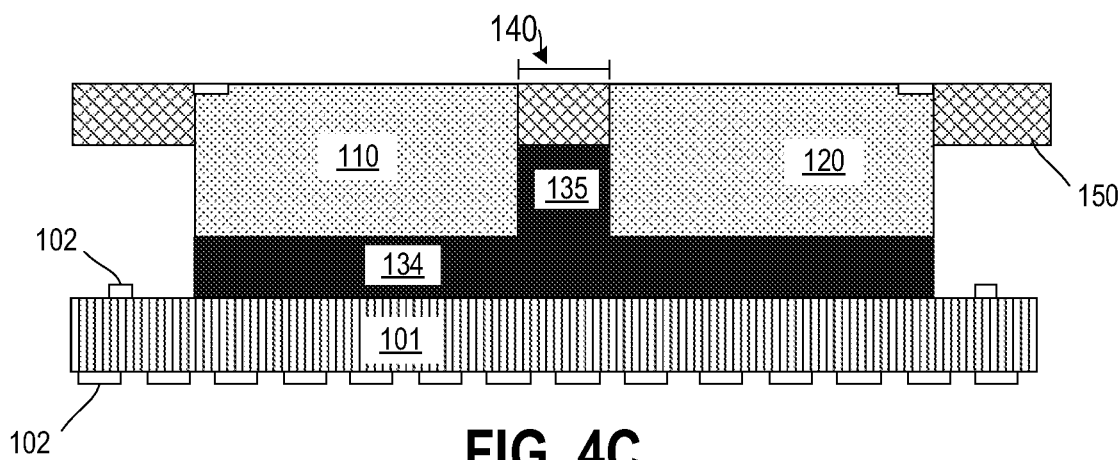

At process 330, the method 300 includes attaching a first biological chip and a second biological chip to the substrate. As shown in FIG. 4C, a first biological chip 110 and a second biological chip 120 are attached to the PCB 101 using the adhesive layer 134 on the substrate. This attaching process is carried out using the stencil 150 to guide the positioning of the biological chips, with the biological chips inserted through the openings 152 of stencil 150. It can be seen that the first biological chip 110 and the second biological chip 120 are spaced apart by a gap 140. The size of the gap 140 is determined by the pattern in the stencil 150. It can also be seen in FIG. 4C that a portion 135 of the adhesive 134 is pushed up and now resides in a lower portion of the gap 140. Alternatively, a separate second adhesive can be formed in the gap above the adhesive layer 134 after the stencil is removed.

Figure 4D:
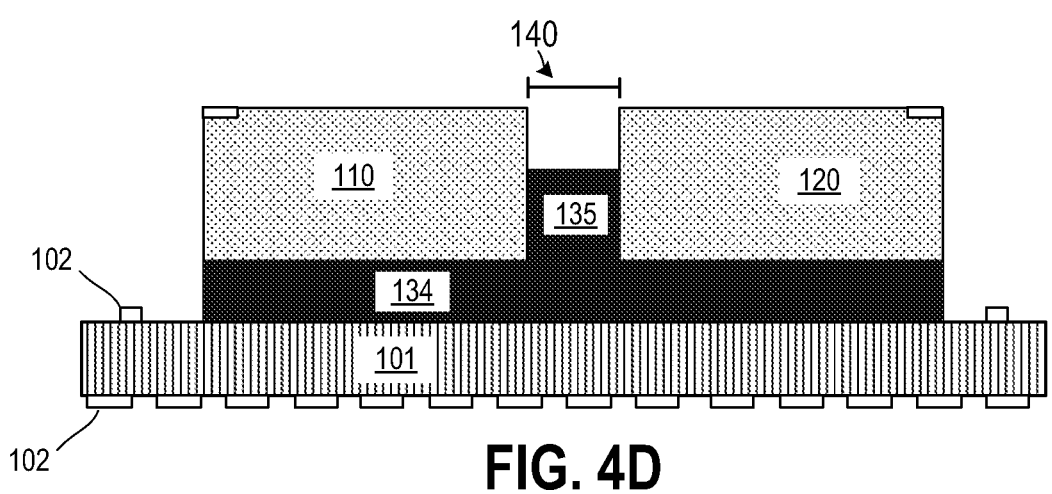

In process 340 of method 300, the stencil is removed. As shown in FIG. 4D, the stencil 150 is removed, leaving the first biological chip 110 and the second biological chip 120 attached to the PCB 101 using adhesive layer 134. FIG. 4D also shows the first biological chip 110 and the second biological chip 120 spaced apart by a gap 140. It can also be seen in FIG. 4 that a portion of the adhesive 134 is pushed up and now resides in a lower portion 135 of the gap 140.

In some embodiments, the adhesive layer 134 can then undergo a curing process to harden. Various different curing processes can be used, such as heat, moisture or ultraviolet illumination curing.

Figure 4E:
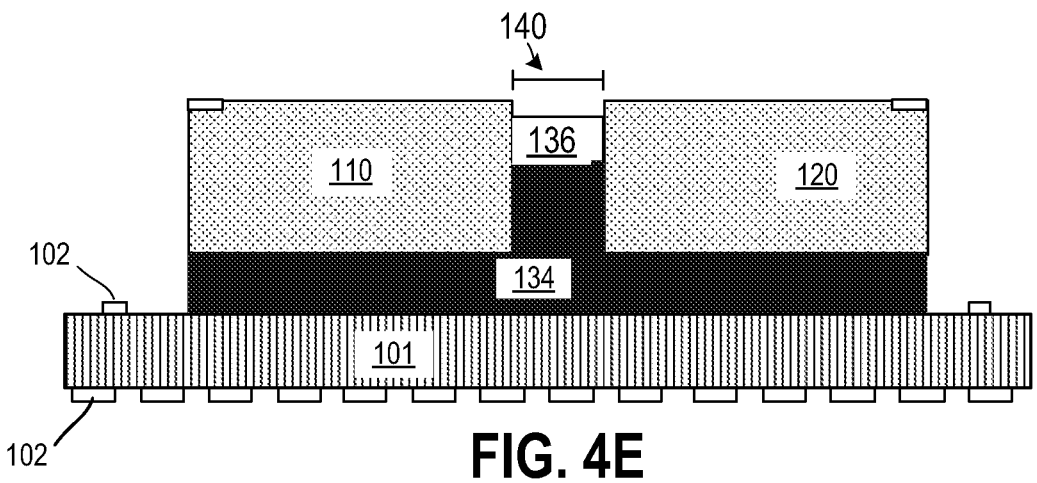

At process 350, the method 300 includes forming an intermediate layer in the gap 140 between biological chips. In some embodiments, as shown in FIG. 4E, an intermediate layer 136 is formed in the gap 140 over the adhesive layer 134. The intermediate layer 136 can provide adhesion between the adhesive 134 and a top surface layer above the intermediate layer 136. Process 350 can be an optional step. In some embodiments, the intermediate layer is not needed. More details of the top surface layer is described below in connection with process 360 and FIGS. 4F and 4G. In some embodiments, the intermediate layer can be a sealant. A sealant is a substance used to block the passage of fluids through the surface or joints or openings in materials. Sealants can be made from acrylic polymers, butyl polymers, and silicone polymers, or synthetic-polymer-based sealants. A sealant can be inject printed onto the intermediate layer 136 through a stencil that has an opening to allow the materials for the intermediate layer to be deposited in the gap above the adhesive layer 134.

Figure 4F:
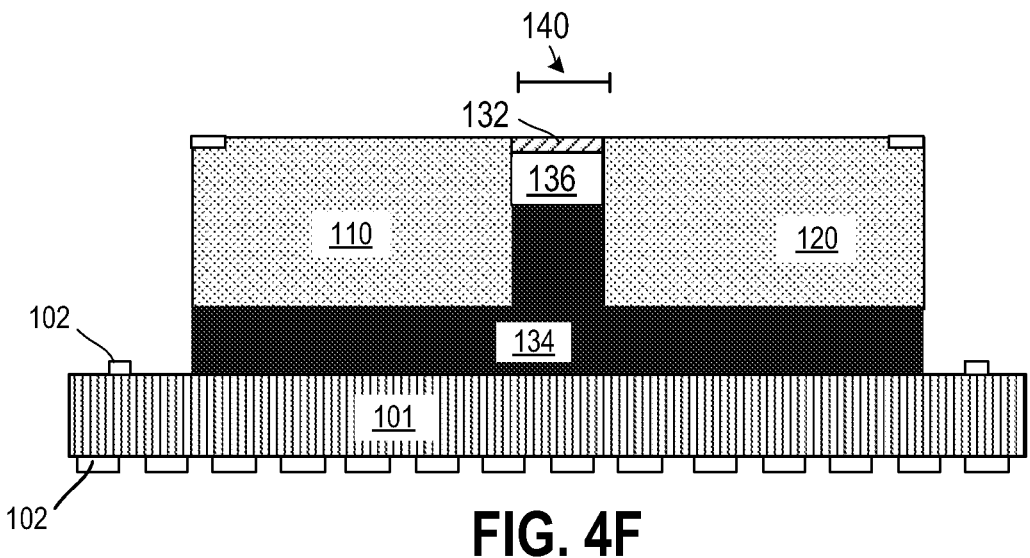

At process 360, the process 300 includes forming a surface layer in the gap between the biological chips. As shown in FIG. 4F, a surface layer 132 is formed in the gap over the intermediate layer 136. The surface layer 132 in FIG. 4F is similar to the first layer, or surface layer, 132 in FIG. 1. The surface layer 132 is configured to be compatible with biological samples and reagents disposed on the first biological chip and the second biological chip. In some embodiments, the surface layer 132 is hydrophobic.

In some embodiments, the surface layer in the filler can include a mold release material. For example, a release agent is a chemical used to prevent other materials from bonding to surfaces. It can provide a solution in processes involving mold release, die-cast release, plastic release, adhesive release, and tire and web release. There are several distinct release agent categories: sacrificial, PVA (polyvinyl alcohol), PTFE (polytetrafluoroethylene), and reactive polysiloxanes. There are also silicone-based release agents. The mold release material can be sprayed through a stencil into the gap between the first biological chip and the second biological chip to form the surface layer.

In some embodiments, the surface layer in the filler can include a titanium material. The titanium material can be sputtered through a stencil into the gap between the first biological chip and the second biological chip to form the surface layer.

In some embodiments, the surface layer in the filler can include a poly(p-xylylene) polymer. The poly(p-xylylene) polymer, such as that under the trade name of Parylene, is a hydrophobic, chemically resistant coating with good barrier properties for inorganic and organic media, strong acids, caustic solutions, gases and water vapor. The hydrophobic surface layer can be formed by chemical vapor deposition, using a mask layer with an opening to expose the gap between the biological chips.

Figure 4G:
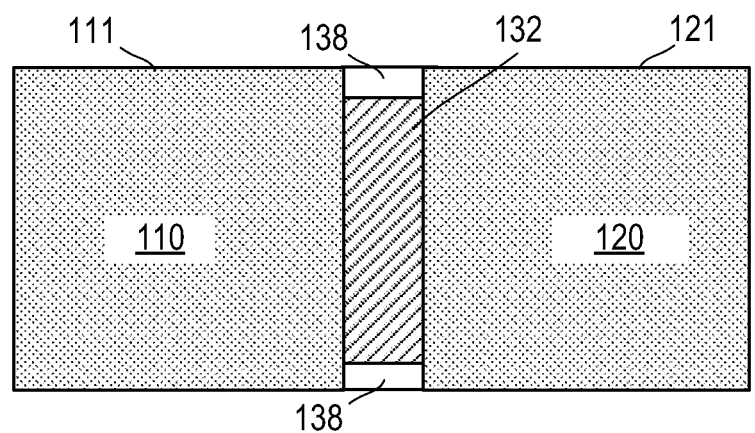

The method 300 can also include removing the edges from the surface layer to facilitate bonding with a microfluidic housing. FIG. 4G is a top view diagram illustrating two biological chips and a top surface layer formed in the gap between biological chips. FIG. 4G shows the top surface 111 of the first biological chip 110 and the top surface 121 of the second biological chip 120. FIG. 4 also shows a top surface of the surface layer 132 of filler 130. In some embodiments, the surface layer 132 is removed at the edges 138 of the surface layer 132. As described above, in some embodiments, the surface layer 132 is hydrophobic and serves as an interface between the first biological chip 110 and the second biological chip 120. However, a hydrophobic surface may not compatible with a microfluidic housing to form a flow cell. Therefore, the hydrophobic material is removed at the edges as shown in FIG. 4G. The removal can be carried out, for example, by laser milling to expose the layer underneath the surface layer 132 at bond lines, where the package is to be bonded with a microfluidic housing.

Figure 5:
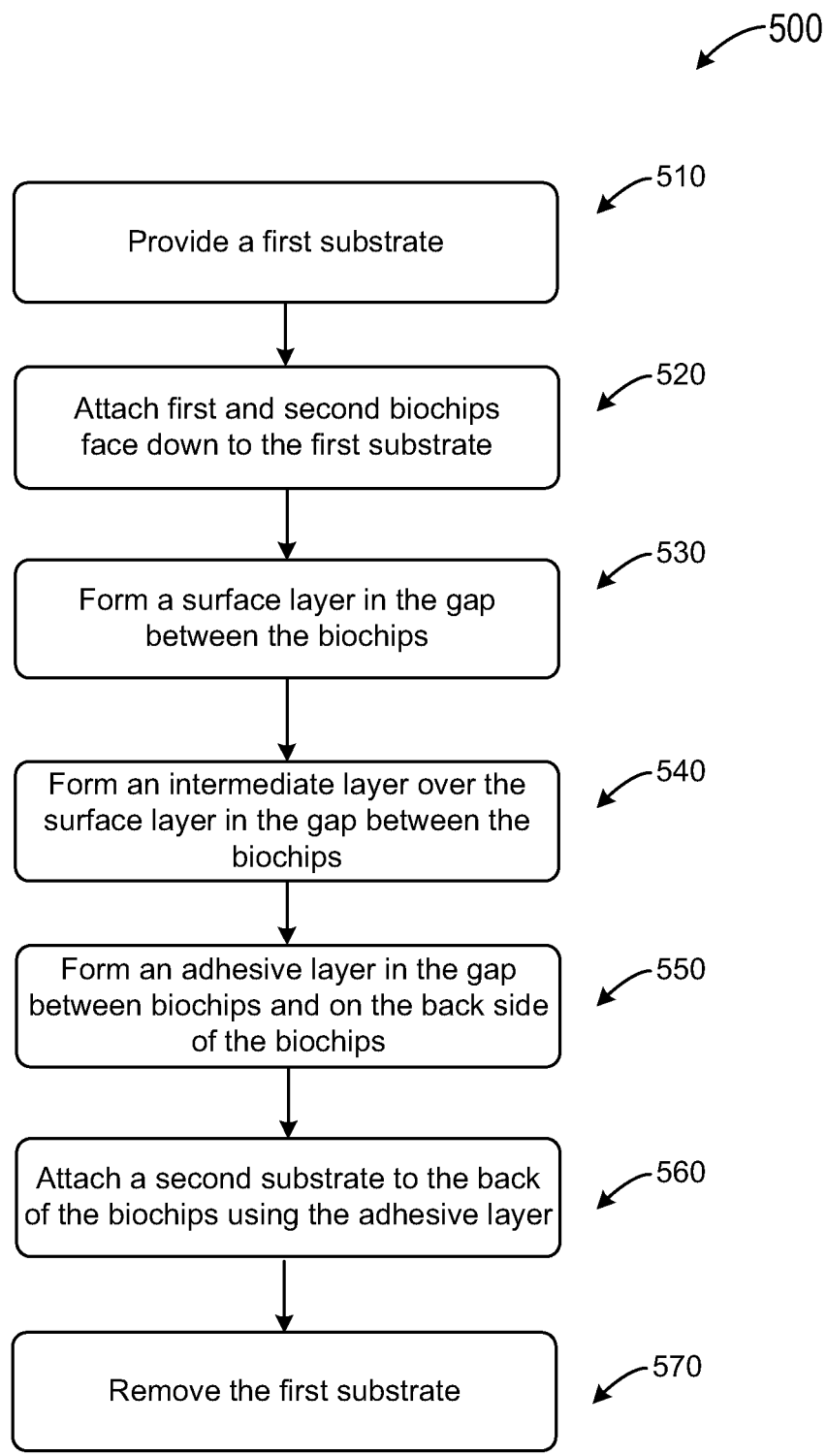
FIG. 5 is a flowchart illustrating another method for forming a multiple-biological chip apparatus according to some embodiments of the present invention.

FIG. 5 is a flowchart illustrating another method for forming a multiple-biological chip apparatus according to some embodiments of the present invention. FIGS. 6A-6H are cross-sectional view diagrams illustrating the method summarized in the flowchart of FIG. 5 according to some embodiments of the present invention. This alternative method for forming a multiple-biological chip apparatus, such as the multiple-biological chip apparatus 100 of FIG. 1 is now described with reference to the flowchart of FIG. 5 and the cross-sectional view diagrams in FIGS. 6A-6H.

As shown in FIG. 5, method 500 for forming a multiple-biological chip apparatus can be summarized as follows.

At 510—Provide a first substrate;
At 520—Attach a first biological chip and a second biological chip face down to the first substrate;
At 530—Form a surface layer in the gap between the biological chips;
At 540—Form an intermediate layer over the surface layer in the gap between the biological chips;
At 550—Form an adhesive layer in the gap between biological chips and on the back side of the biological chips;
At 560—Attach a second substrate to the back of the biological chips using the adhesive layer; and
At 570—Remove the first substrate.

These processes are described in more detail below.

Figure 6A:
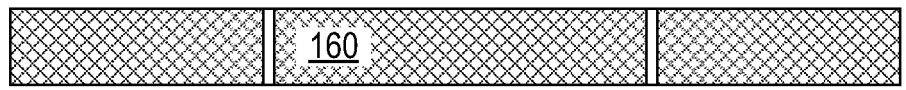
FIGS. 6A-6H are cross-sectional view diagrams illustrating the method summarized in the flowchart of FIG. 5 according to some embodiments of the present invention.

FIG. 6A is a cross-sectional view diagram illustrating a first substrate that can be used in the method of FIG. 5. In process 510, the method 500 starts with providing a first substrate. In some embodiments, the first substrate can be a vacuum stage for holding biological chips for processing. For example, FIG. 6A shows a vacuum stage 160 that can be used in the method 500 of FIG. 5. The vacuum stage can include openings 162 for holding biological chips in place. The vacuum can be turned off to release the biological chips.

Figure 6B:
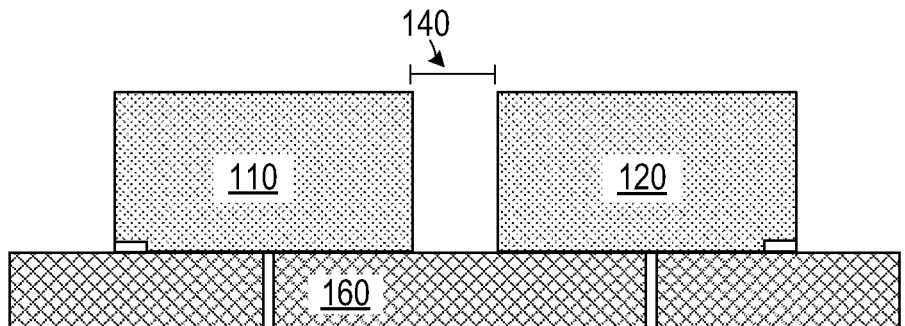

FIG. 6B is a cross-sectional view diagram illustrating a first biological chip and a second biological chip attached to the first substrate in the method of FIG. 5. At process 520, the method 300 includes attaching a first biological chip and a second biological chip to the substrate. As shown in FIG. 6B, a first biological chip 110 and a second biological chip 120 are attached to the vacuum stage 160 using the vacuum provided through openings 162 in the vacuum stage 160. Alternatively, a first biological chip 110 and a second biological chip 120 can be attached to a substrate using an adhesive layer on the substrate. This attaching process can be carried out using a stencil to guide the positioning of the biological chips, with the biological chips inserted through the openings of the stencil, similar to the processes described above in connection with FIGS. 4A-4C. It can be seen that the first biological chip 110 and the second biological chip 120 are spaced apart by a gap 140. The size of the gap 140 is determined by the pattern in the stencil 150. It can also be seen in FIG. 4C that a portion of the adhesive 134 is pushed up and now resides in a lower portion 135 of the gap 140.

Figure 6C:
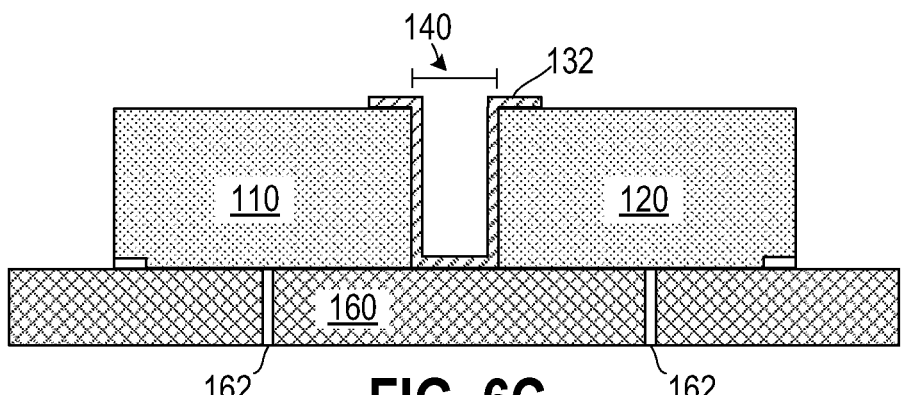

At process 530, the method includes forming a surface layer in the gap between the biological chips. FIG. 6C is a cross-sectional view diagram illustrating a surface layer formed in the gap between the biological chips in the method of FIG. 5. As shown in FIG. 6C, a surface layer 132 is formed in the gap 140 between the biological chips. The surface layer 132 in FIG. 6C is similar to the first layer, or surface layer, 132 in FIG. 4F. The surface layer 132 is configured to be compatible with biological samples and reagents disposed on the first biological chip and the second biological chip. In some embodiments, the surface layer 132 is hydrophobic.

In some embodiments, the surface layer in the filler can include a mold release material. A release agent is a chemical used to prevent other materials from bonding to surfaces. It can provide a solution in processes involving mold release, die-cast release, plastic release, adhesive release, and tire and web release. There are several distinct release agents categories: sacrificial, PVA (polyvinyl alcohol), PTFE (polytetrafluoroethylene), and reactive polysiloxanes. There are also silicone-based release agents. The mold release material can be sprayed through a stencil into the gap between the first biological chip and the second biological chip to form the surface layer.

In some embodiments, the surface layer in the filler can include a titanium material. The titanium material can be sputtered through a stencil into the gap between the first biological chip and the second biological chip to form the surface layer.

In some embodiments, the surface layer in the filler can include a poly(p-xylylene) polymer. The poly(p-xylylene) polymer, such as that under the trade name of Parylene, is a hydrophobic, chemically resistant coating with good barrier properties for inorganic and organic media, strong acids, caustic solutions, gases and water vapor. The hydrophobic surface layer can be formed by chemical vapor deposition, using a mask layer with an opening to expose the gap between the biological chips.

Figure 6D:
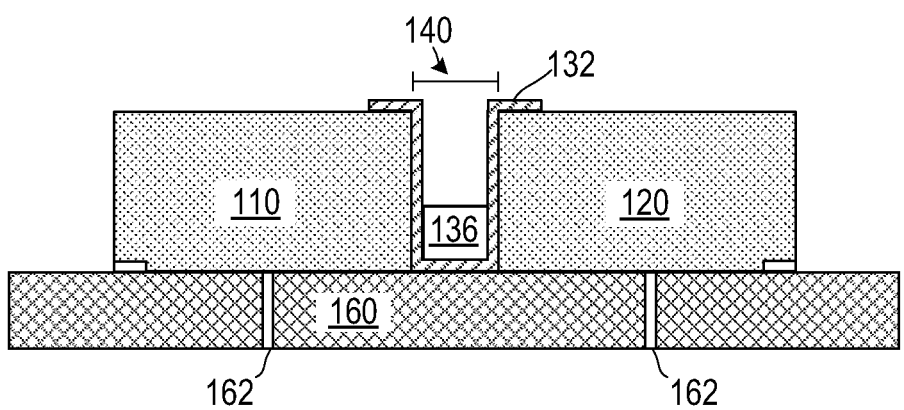

At process 540, the method 500 includes forming an intermediate layer over the surface layer in the gap between the biological chips. FIG. 6D is a cross-sectional view diagram illustrating an intermediate layer formed in the gap between biological chips. As shown in FIG. 6D, an intermediate layer 136 is formed in the gap 140 over the surface layer 132. In some embodiments, the intermediate layer 136 provides adhesion between the surface layer 132 and the adhesive 134 that is formed above the intermediate layer 136. More details of the adhesion layer 134 is described below in connection with process 550 and FIG. 6E. In some embodiments, the intermediate layer can be a sealant. A sealant is a substance used to block the passage of fluids through the surface or joints or openings in materials. Sealants can be made from acrylic polymers, butyl polymers, and silicone polymers, or synthetic-polymer-based sealants. A sealant can be inject printed onto the intermediate layer 136 through a stencil that has an opening to allow the materials for the intermediate layer to be deposited in the gap above the surface layer 132.

Figure 6E:
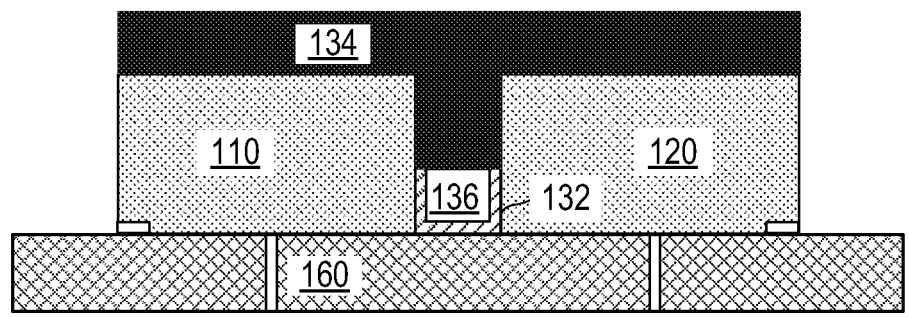

At process 550, the method 500 includes forming an adhesive layer in the gap between biological chips and on the back side of the biological chips. FIG. 6E is a cross-sectional view diagram illustrating an adhesive layer in the gap between biological chips and on the back side of the biological chips. As shown in FIG. 6E, an adhesive layer 134 is disposed in the gap between biological chips and on the back side of the biological chips. Adhesive layer 134 in FIG. 6E is similar to adhesive layer 134 in FIG. 134 in FIG. 4B. In some embodiments, the adhesive layer 134 can be a be an epoxy adhesive. Epoxy adhesives can be made of epoxy resins, also known as polyepoxides, which are a class of reactive prepolymers and polymers which contain epoxide groups.

Alternatively, the adhesive layer 134 is a die attach film (DAF) used for attaching a semiconductor die to a substrate. The die attach film can include materials such as an epoxy resin, a phenol resin, acrylic rubber, silica filler, or a combination thereof, and may be applied using a lamination technique. An example of die attach adhesive is ABLE-BOND® 789-3™, made by Henkel Chemicals Company, Dusseldorf, Germany. However, any other suitable alternative materials and formation techniques may alternatively be used.

Figure 6F:
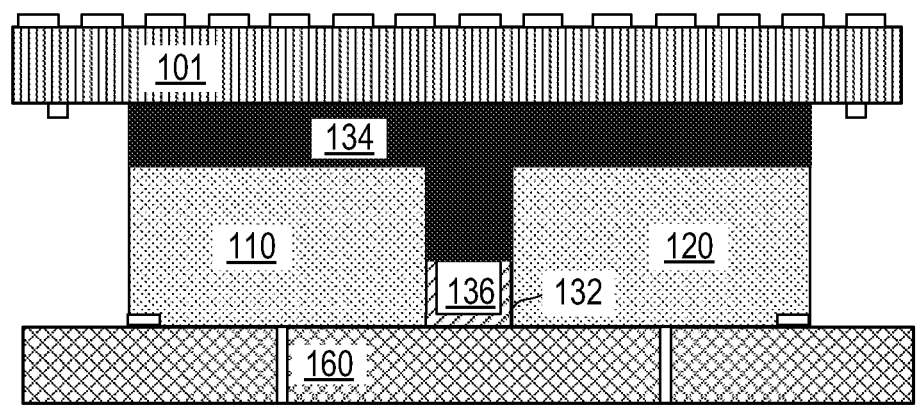

At process 560 of the method 500, a second substrate is attached to the back of the biological chips using the adhesive layer. FIG. 6F is a cross-sectional view diagram illustrating a second substrate attached to the back of the biological chips using the adhesive layer. FIG. 6F shows a printed circuit board (PCB) 101 attached to the biological chips using the adhesive layer 134. The PCB 101 in FIG. 6F can include bonding pads for making electrical connections with the electronic components on the circuit board and for making electrical connections with external components.

Figure 6G:
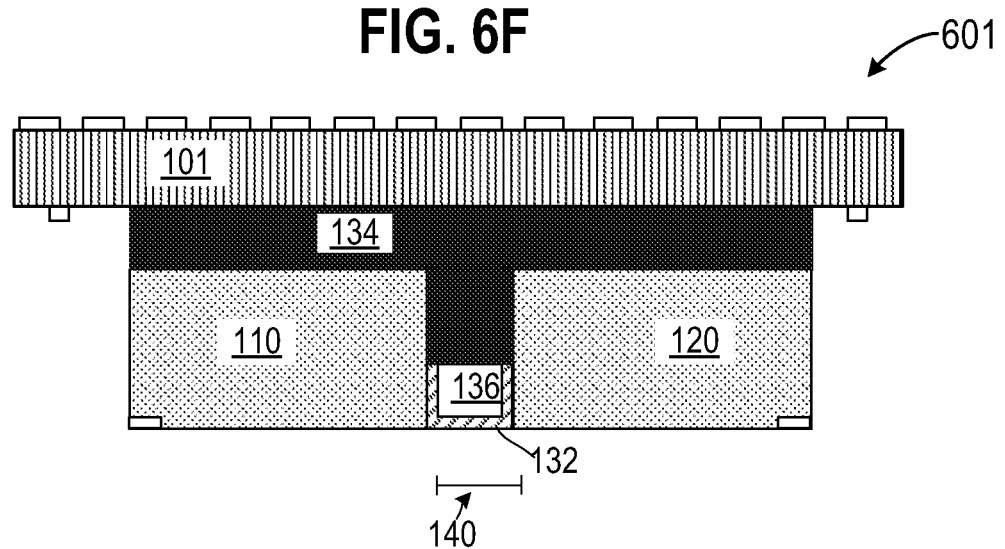

At process 570, the method 500 includes removing the first substrate. FIG. 6G is a cross-sectional view diagram illustrating the first substrate 160 removed from the biological chips in the structure of FIG. 6E, resulting in a multiple-chip structure 601. The multiple-chip structure 601 in FIG. 6E is positioned up-side-down. The multiple-chip structure 601 in FIG. 6E can be rotated to an upright position, as shown in FIG. 6H.

Figure 6H:
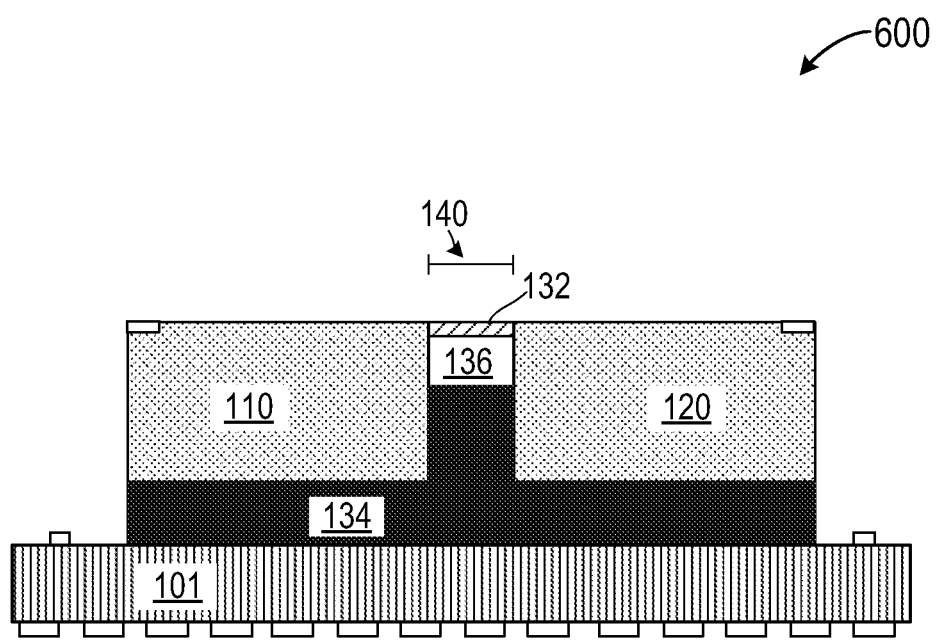

FIG. 6H is a cross-sectional view diagram illustrating two biological chips disposed on the second substrate with a filler between the biological chips in the method of 500. As shown in FIG. 6H, a multiple-chip structure 600, which is similar to the apparatus 100 in FIG. 1. The multiple-chip structure 600 include the first and second biological chips, 110 and 120, respectively, attached to a PCB 101, with the gap 140 between the first and second biological chips covered with the surface layer 132 in the filler. The surface layer 132 is disposed over the adhesive layer 134. The surface layer 132 has a hydrophobic surface that is co-planar with a top surface of the first biological chip 110 and a top surface of the second biological chip 120.

Figure 7:
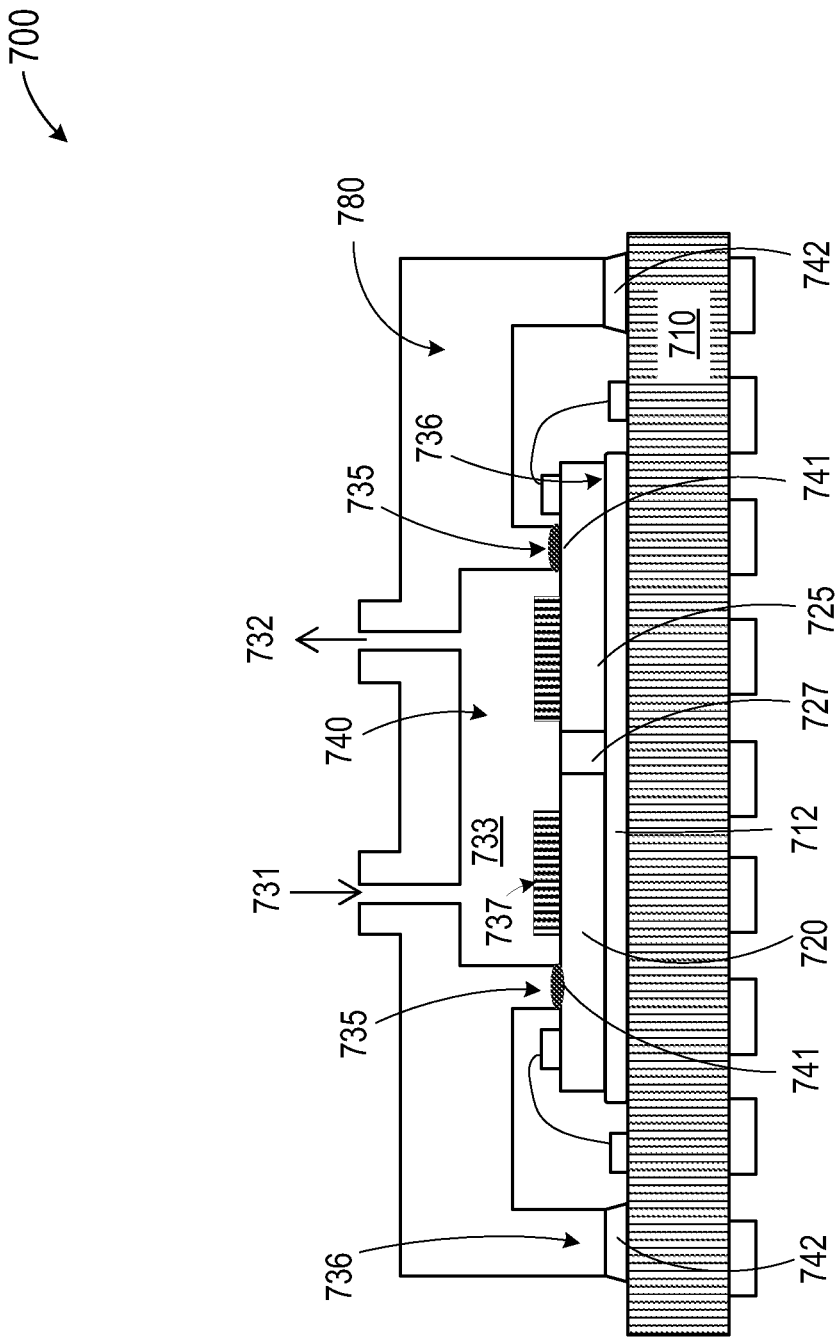
FIG. 7 is a simplified diagram illustrating a microfluidic device having multiple biological chips attached to a PCB according to some embodiments of the present invention.

FIG. 7 is a simplified diagram illustrating a microfluidic device having multiple biological chips attached to a PCB according to some embodiments of the present invention. As shown in FIG. 7, microfluidic device 700 includes a PCB (printed circuit board) 710, a first biological chip 720 and a second biological chip 725 overlying the PCB, and a microfluidic housing 780 overlying the biological chips and the PCB. The microfluidic housing 780 is attached to the biological chips 720 and 725 using a first adhesive layer 741 to form a flow cell, and the microfluidic housing 780 is attached to the PCB 710 using a second adhesive layer 742 to provide mechanical support. The biological chips 720 and 725 can be attached to the PCB 710, for example, using a die attach adhesive layer 712 that attaches the biological chips to the PCB. Further, a filling section 727 can be formed to fill in the space between biological chips 720 and 725.

In some embodiments, the filling section 727 can be similar to the filler 130 described above in connection to FIGS. 1-6G. The filler section 727 can include an adhesive layer extending between a side surface of the first biological chip and a side surface of the second biological chip, the second adhesive layer attaching the first biological chip to the second biological chip. The filler section also includes a surface layer disposed over the second adhesive layer. The surface layer has a hydrophobic surface that is co-planar with a top surface of the first biological chip and a top surface of the second biological chip.

In FIG. 7, the microfluidic housing 780 has an inlet 731, an outlet 732, and a first cavity 733. The microfluidic housing 780 can have an inner sidewall 735 adjacent to the cavity 733, and the inner sidewall is attached to the biological chips 720 and 725 using the first adhesive layer 741 to form a flow cell 740 with a hermetic seal. The flow cell 740 includes a channel formed by the cavity 733 between the microfluidic housing 780, inner sidewalls 735 of the microfluidic housing, and the biological chips 720 and 725. A biological sample 737 can be introduced through the inlet 731 into the cavity 733, where the chips 720 and 725 can determine the properties of the biological sample 737. Afterwards, the biological sample 737 can be removed from the cavity 733 through the outlet 732.

As shown in FIG. 7, the microfluidic housing 780 can also have an outer sidewall 736 attached to the PCB 710 using a second adhesive layer 742 to provide mechanical support. In some embodiments, the biological chips 720 and 725 are electrically coupled to the PCB 710 using wire bonds, similar to those described in FIG. 1. In this regard, the microfluidic housing 780 can also include second cavities for accommodating wire bonds.

The first adhesive layer 741 forms a hermetic seal between the microfluidic housing 780 and the biological chips 720 and 725 that is air tight and liquid tight. Further, the first adhesive layer 741 is compatible with the materials used in the flow cell and its operation. On the other hand, the second adhesive layer 742 is configured to provide mechanical strength in the joint between the microfluidic housing 780 and the PCB 710.

In some embodiments of the above microfluidic apparatus, the first adhesive material is a solid before curing and substantially maintains its thickness after curing to provide accuracy and uniformity of the height of the microfluidic apparatus. The second adhesive material is a liquid before curing to adjust for variations in the distance between a bottom surface of the outer sidewall and the PCB. In some embodiment, the second adhesive material has a higher curing shrinkage than the first adhesive material. In some embodiments, the first adhesive material includes a die attach film (DAF), and the second adhesive material includes liquid epoxy.

In some embodiments of the above microfluidic apparatus, the first adhesive material is a compliant adhesive after curing to accommodate mismatched thermal expansion between biological chip and the microfluidic housing through thermal cycles during operation. The second adhesive material is in liquid form before curing. In some embodiments, the first adhesive material includes a compliant urethane adhesive material, and the second adhesive material includes liquid epoxy. In alternative embodiments, the first adhesive material includes a pressure sensitive adhesive (PSA), and the second adhesive material comprises liquid epoxy.

Figure 8:
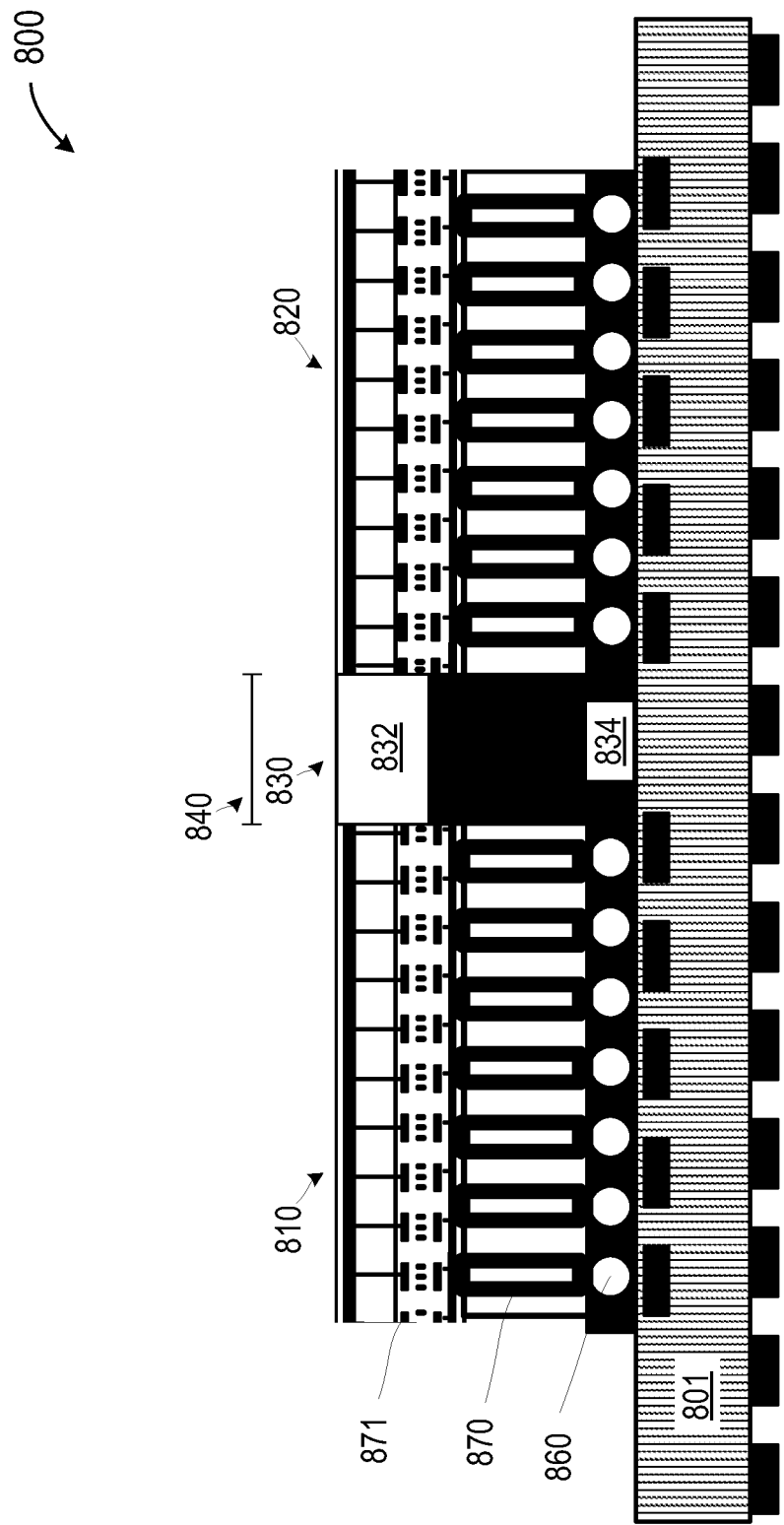
FIG. 8 is a simplified cross-sectional view diagram illustrating another apparatus including multiple biological chips according to some embodiments of the present invention.

FIG. 8 is a simplified cross-sectional view diagram illustrating another integrated apparatus including multiple biological chips according to some embodiments of the present invention. As shown in FIG. 8, apparatus 800 includes a first biological chip 810 and a second biological chip 820 are disposed on a substrate 801, with the first biological chip and the second biological chip spaced apart by a gap 840, similar to apparatus 100 described above in connection to FIG. 1. Apparatus 800 also includes a filler 830 disposed in the gap 840 between the first biological chip 810 and the second biological chip 820. Similar to the filler 130 in FIG. 1, the filler 830 in FIG. 8 has a first layer (surface layer) 832 and a second layer (adhesive layer) 834. The first layer 832 is disposed between the top surface of the first biological chip 810 and the top surface of the second biological chip 820. In some cases, the first layer 832 is coplanar to the top surface of the first biological chip 810 and the top surface of the second biological chip 820. The first layer 832 is configured to be compatible with biological samples and reagents disposed on the first biological chip and the second biological chip. In some embodiments, the first layer is 832 has a hydrophobic surface. The second layer 834 is an adhesive layer disposed under the first layer 832. At least a portion of the second layer 834 is disposed between a side wall of the first biological chip 810 to a side wall of the second biological chip 820. The second layer 834 is configured to provide adhesion between the biological chips 810 and 820 and provide adhesion to the substrate 801. The second layer 834 is also configured to provide mechanical strength of the integrated apparatus. In some embodiments, the filler 830 can also include an intermediate layer similar to intermediate layer 136 in FIG. 1.

In some embodiments of the above apparatus, the first layer 832 in the filler can include a mold release material. In alternative embodiments, the first layer 832 in the filler can include a titanium material. In other embodiments, the first layer 832 in the filler can include a poly(p-xylylene) polymer. In some embodiments, the second layer 834 can include an epoxy adhesive. In some embodiments, the second layer can include a die attach adhesive.

In apparatus 100 of FIG. 1, the biological chips are electrically connected to the substrate 101, e. g., a PCB, by wire bonding. In contrast, in apparatus 800 in FIG. 8, the biological chips are electrically connected to the PCB 801 by solder balls 860 disposed between the back surfaces of the biological chips and the PCB. The solder balls can be connected to the devices at the front portion of the biological chips, such as biosensors, by through-silicon vias (TSVs) 870. In packaging technology, the through-silicon via (TSV) or through-chip via is a vertical electrical connection (via) that passes completely through a silicon wafer or die. Compared with alternatives technologies, TSVs can increase device density and shorten the length of the connections.

In some embodiments, the first biological chip 810 can be a biological sensor. The biological sensor can include flow cells overlying a complementary metal-oxide-semiconductor (CMOS) sensor layer 871. The CMOS sensor layer 871 can be coupled to the substrate 801, such as a PCB, through the TSVs 870 and solder balls 860. Other devices, such as processors, connected to the PCB can process the signals provided by the CMOS sensor layer 871.

In integrated circuit packaging, a solder ball, also referred to as a solder bump is a ball of solder that provides the contact between a chip package and a printed circuit board. Solder is a fusible metal alloy used to create a permanent bond between metal work pieces. Alloys of lead and tin were commonly used in the past, but lead-free solders have been increasing in use. Soft solder typically has a melting point range of 90 to 450° C. For example, lead-free solder balls can have melting temp of 240-250° C. Eutectic solder balls can have a melting temperature at about 183° C. Special solder balls can have lower melting temperatures. For example, a bismus-containing solder ball can have low melting temperatures of about 138-140° C. Tin-based solder, for example, a tin-lead-bismus solder, $Sn_{43}PB_{43}Bi_{14}$, can have a melting temperature as low as 96° C.

The solder balls can be placed by automated equipment. In FIG. 8, a method for making apparatus 800 can include placing solder balls 860 on the substrate 801, for example, by automated equipment. Then, the adhesive layer 834 or a NCF (non-conductive film) can be disposed on the solder balls. Next, the first biological chip 810 and the second biological chip 820 can be placed over the solder balls and the adhesive layer or the NCF, using the method described above in connection with FIGS. 3 and 4A-4G. The solder balls can protrude through adhesive layer or the NCF to make contact to the bottom surface of the biological chips. The first layer 832 can be formed over the adhesive layer 834. An optional intermediate layer can be formed on the adhesive layer 834 before the formation of the first layer 832.

In an alternative method for making apparatus 800, the solder balls are placed on the PCB, and the biological chips are placed on the solder balls using the method described above in connection with FIGS. 3 and 4A-4G. At this point, the solder balls make electrical contact to the biological chips and the PCB. Next, using an under-fill process, the adhesive layer 834 can be disposed in the gap between the biological chips and fill the space between the solder balls that are located between the biological chips and the PCB. The first layer 832 can be formed over the adhesive layer 834. An optional intermediate layer can be formed on the adhesive layer 834 before the formation of the first layer 832.

In some embodiments, apparatus 800 can also include a microfluidic housing overlying the biological chip and the PCB to form a microfluidic apparatus. Similar to the microfluidic housing 780 in FIG. 7, the microfluidic housing is attached to the biological chip using a first adhesive layer to form a flow cell, and the microfluidic housing is attached to the PCB using a second adhesive layer to provide mechanical support. The properties and materials of the first adhesive layer and the second adhesive layer are similar to those described above in connection to the microfluidic housing 780 in FIG. 7.

Figure 9:
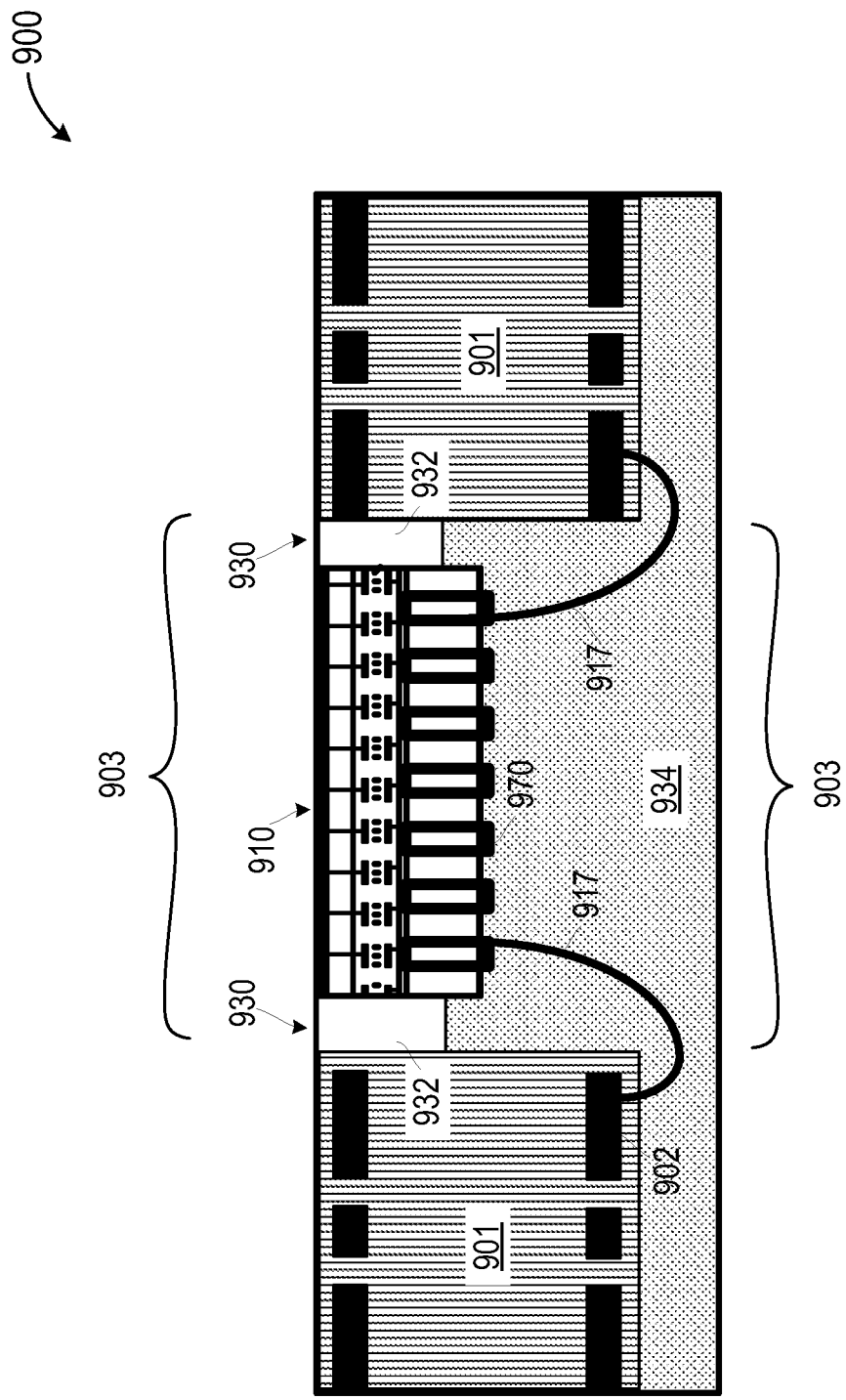
FIG. 9 is a simplified cross-sectional view diagram illustrating another apparatus including a biological chip integrated with a printed circuit board (PCB) according to some embodiments of the present invention.

FIG. 9 is a simplified cross-sectional view diagram illustrating another apparatus including a biological chip integrated with a printed circuit board (PCB) according to some embodiments of the present invention. As shown in FIG. 9, apparatus 900 includes a biological chip 910 disposed in a cavity 903 of a printed circuit board (PCB) 901. In other embodiments, there can be more than one biological chip disposed in the cavity. In FIG. 9, the cavity 903 is a through hole that extends from a front surface to a back surface of the PCB. Apparatus 900 also includes fillers 930 disposed in the gaps between the biological chip 910 and the PCB 901. Similar to the filler 130 in FIG. 1, the filler 930 in FIG. 9 can include a first layer (surface layer) 932 and a second layer (adhesive layer) 934. The first layer 932 is disposed between the top surface of the biological chip 910 and the top surface of the PCB 901. In some cases, the first layer 923 is coplanar to the top surface of the PCB 901 to allow movement of biological samples or reagents. The first layer 932 is configured to be compatible with biological samples and reagents disposed on the first biological chip and the second biological chip. In some embodiments, the first layer is 932 is hydrophobic. The second layer 934 is disposed under the first layer 932. At least a portion of the second layer 934 is disposed between a body portion of the biological chip 910 to a body portion of the PCB 901. The second layer 934 is configured to provide adhesion between the biological chip 910 to the substrate 901. The second layer 934 is also configured to provide mechanical strength of the integrated apparatus. In some embodiments, the filler 930 can also include an intermediate layer similar to intermediate layer 136 in FIG. 1.

In some embodiments of the above apparatus, the first layer 932 in the filler can include a mold release material. In alternative embodiments, the first layer 932 in the filler can include a titanium material. In other embodiments, the first layer 932 in the filler can include a poly(p-xylylene) polymer. In some embodiments, the second layer 934 can include an epoxy adhesive. In some embodiments, the second layer can include a die attach adhesive.

In apparatus 900 in FIG. 9, the biological chip 910 is connected electrically connected to the PCB 901 by bonding wires 917 disposed at the back surfaces of the biological chip 910. The bonding wires 917 can connect bonding pads 902 at the back side of the PCB 901 to through-silicon vias (TSVs) 970 disposed at the back surfaces of the biological chip.

In some embodiments, apparatus 900 can also include a microfluidic housing overlying the biological chip and the PCB to form a microfluidic apparatus. Similar to the microfluidic housing 780 in FIG. 7, the microfluidic housing is attached to the biological chip using a first adhesive layer to form a flow cell, and the microfluidic housing is attached to the PCB using a second adhesive layer to provide mechanical support. The properties and materials of the first adhesive layer and the second adhesive layer are similar to those described above in connection to the microfluidic housing 780 in FIG. 7.

A method for making apparatus 900 can include processes in the method described above in connection with FIGS. 5 and 6A-6H. First, the PCB and the biological chip are placed, face down, on a substrate or a tape. The first layer 932 is formed in the gaps between the biological chips and the PCB, similar to the processes depicted in FIGS. 6A-6C. An optional intermediate layer can be disposed over the first layer, similar to the process depicted in FIG. 6D. Next, bonding wires 917 can be formed between the biological chip and the PCB. Then, the adhesive layer 934 can be disposed on the structure, similar to the process depicted in FIG. 6E. The structure is then flipped over as the apparatus 900.

Figure 10:
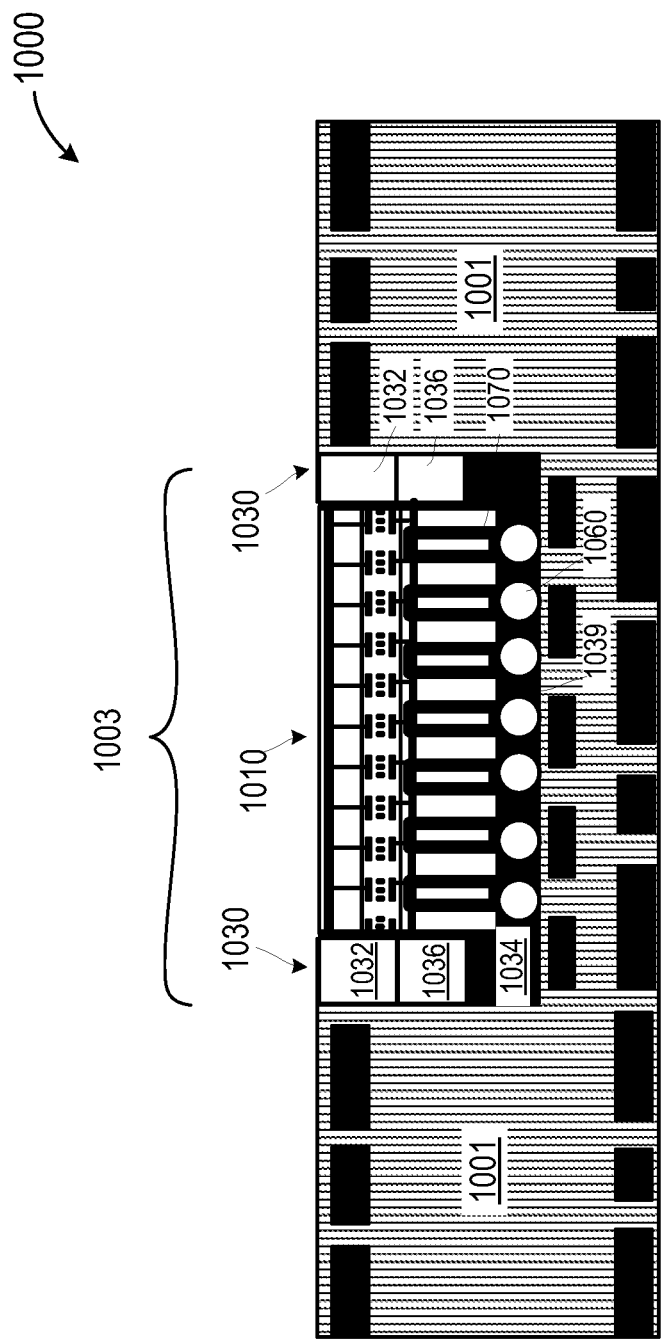
FIG. 10 is a simplified cross-sectional view diagram illustrating another apparatus including a biological chip integrated with a printed circuit board (PCB) according to some embodiments of the present invention.

FIG. 10 is a simplified cross-sectional view diagram illustrating another apparatus including a biological chip integrated with a printed circuit board (PCB) according to some embodiments of the present invention. As shown in FIG. 10, apparatus 1000 includes a biological chip 1010 disposed in a cavity 1003 of a printed circuit board (PCB) 1001. In other embodiments, there can be more than one biological chip disposed in the cavity. In FIG. 10, the cavity 1003 is referred to as a half cavity that extends partially from the PCB 1001. Apparatus 1000 also includes fillers 1030 disposed in the gaps between the biological chip 910 and the PCB 1001. Similar to the filler 130 in FIG. 1, the filler 1030 in FIG. 10 can include a first layer 1032 and a second layer 1034. The first layer and the second layer are also referred to as the surface layer and the adhesive layer, respectively. The first layer 1032 is disposed between the top surface of the biological chip 810 and the top surface of the PCB 1001. The first layer 1032 is configured to be compatible with biological samples and reagents disposed on the first biological chip and the second biological chip. In some embodiments, the first layer 1032 is hydrophobic. The second layer 1034 is disposed under the first layer 1032. At least a portion of the second layer 1034 is disposed between a body portion of the biological chip 1010 to a body portion of the PCB 1001. The second layer 1034 is configured to provide adhesion between the biological chip 1010 to the substrate 2001. The second layer 1034 is also configured to provide mechanical strength of the integrated apparatus. In some embodiments, filler 1030 can also include an intermediate layer similar to intermediate layer 136 in FIG. 1.

In some embodiments of the above apparatus, the first layer 1032 in the filler can include a mold release material. In alternative embodiments, the first layer 1032 in the filler can include a titanium material. In other embodiments, the first layer 1032 in the filler can include a poly(p-xylylene) polymer. In some embodiments, the second layer 1034 can include an epoxy adhesive. In some embodiments, the second layer can include a die attach adhesive.

In apparatus 1000 in FIG. 10, the biological chip 1010 is electrically connected to the PCB 1001 by solder balls 1060 disposed on a bottom surface of the half cavity 1003. at the back surface of the biological chip 1010. The solder balls 1060 can be connected to the devices, such as biosensors, at the front portion of the biological chips by through-silicon vias (TSVs) 1070. The solder balls 1060 can be connected to the PCB through bond pads at the bottom surface of the half cavity 1003 to reach bond pads at the back surface of the PCB 1001 for connection to external devices. An under fill layer 1039 can be disposed between the bottom surface of the biological chip 1010 and the bottom surface of the half cavity 1003 in the PCB 1001. The under layer can distribute thermal mechanic stress from solder balls to improve solder ball reliability.

In some embodiments, apparatus 1000 can also include a microfluidic housing overlying the biological chip and the PCB to form a microfluidic apparatus. Similar to the microfluidic housing 780 in FIG. 7, the microfluidic housing is attached to the biological chip using a first adhesive layer to form a flow cell, and the microfluidic housing is attached to the PCB using a second adhesive layer to provide mechanical support. The properties and materials of the first adhesive layer and the second adhesive layer are similar to those described above in connection to the microfluidic housing 780 in FIG. 7.

In a method for making apparatus 1000, the solder balls are placed on the bottom surface of the half cavity in the PCB 1001, and the biological chips are placed on the solder balls using the method described above in connection with FIGS. 3 and 4A-4G. At this point, the solder balls make electrical contact to the biological chips and the PCB. Next, using an under-fill process, the adhesive layer 1034 can be disposed in the gap between the biological chips and fill the space between the solder balls that are located between the biological chips and the PCB. The first layer 1032 can be formed over the adhesive layer 834. An optional intermediate layer 1036 can be formed on the adhesive layer 1034 before the formation of the first layer 1032. The intermediate layer 1034 can be configured to function as a glue between the first layer 1032 and the adhesive layer 1034.

Some embodiments of the present invention can be used in the analysis of biological or chemical samples. The biological or chemical samples may include any of a number of components. For example, a sample may contain nucleic acid macromolecules (e.g., templates, DNA, RNA, etc.), proteins, and the like. The sample may be analyzed to determine a gene sequence, DNA-DNA hybridization, single nucleotide polymorphisms, protein interactions, peptide interactions, antigen-antibody interactions, glucose monitoring, cholesterol monitoring, and the like.

In some embodiments, the biological sample can be a nucleic acid, such as DNA. See U.S. Pat. Nos. 8,778,849; 8,445,194; 9,671,344; 7,910,354; 9,222,132; 6,210,891; 6,828,100; 6,833,246; 6,911,345, and Pat. App. Pub. No. 2016/0237488, herein incorporated by reference in their entireties. Without limitation, the DNA biomolecule may be a DNA nanoball (single stranded concatemer) hybridized to labeled probes (e.g., in DNB sequencing by ligation or cPAL methods) or to complementary growing strands (e.g., in DNB sequencing by synthesis methods) or both; or a single DNA molecule (e.g., in single molecule sequencing); or to a clonal population of DNA molecules, such as is created in bridge PCR-based sequencing. Thus, reference to "a biomolecule," "a DNA macromolecule" or "a nucleic acid macromolecule" may encompass more than one molecule (e.g., a DNB associated with multiple growing complementary strands or a DNA cluster comprising clonal population of hundreds or thousands of DNA molecules). Exemplary methods for making DNBs (e.g., DNB libraries) and for making arrays of discrete spaced apart regions separated by inter-regional areas are well known in the art. See, for example, U.S. Pat. Nos. 8,133,719; 8,445,196; 8,445,197; and 9,650,673, herein incorporated by reference in their entireties. In some embodiments, DNBs or other macromolecules are immobilized on discrete spaced apart regions, or spots, through attractive noncovalent interactions (e.g., Van der Waal forces, hydrogen bonding, and ionic interactions). In some embodiments, discrete spaced apart regions comprise functional moieties (e.g., amines). In some embodiments, discrete spaced apart regions comprise oligonucleotides attached thereto, for binding template DNAs (e.g., DNBs). Generally, the discrete spaced apart regions are arranged in a rectilinear pattern; however, regular arrays with other arrangements (e.g., concentric circles of regions, spiral patterns, hexagonal patterns, and the like) may be used.

In some embodiments, the nucleic acid macromolecules may be amplicons of genomic DNA fragments or a cDNA library. As used herein, an "amplicon" may be the product of amplification of a nucleic acid molecule, typically a fragment of genomic DNA or a cDNA library. Methods of amplification include, but are not limited to, rolling circle amplification, as described, for example, in U.S. Pat. No. 8,445,194 (herein incorporated by reference in its entirety), or bridge polymerase chain reaction (PCR), as described, for example, in U.S. Pat. No. 7,972,820, herein incorporated by reference in its entirety. The amplification may be performed before the nucleic acid is contacted with the biosensor, or in situ, as described, for example, in U.S. Pat. No. 7,910,354, herein incorporated by reference in its entirety.

For example, a biological sample, such as a DNA macromolecule, oligonucleotide, or nucleotide, associated with a fluorescent or chemiluminescent dye, may be placed above a photodiode. In the case of fluorescence, the dye may be illuminated by excitation light from an excitation light source. The excitation light may correspond to any suitable type or intensity of light, including, for example, visible light, infrared (IR), ultraviolet (UV), and the like. The excitation light may also come from any suitable source, such as light emitting diodes (LEDs), lamps, lasers, combinations thereof, and the like. When the dye is illuminated with excitation light at a certain wavelength, the biological sample may absorb the light, then emit light of a different wavelength. For example, the biological sample may absorb excitation light having a 450 nm wavelength, but emit light with a 550 nm wavelength. In other words, fluorescent light of a characteristic wavelength may be emitted when the dye is illuminated by light of a characteristic different wavelength (i.e., the excitation light source). Because excitation light is used to illuminate a dye resulting in fluorescence, however, it must be filtered out in order to take accurate measurements of fluorescence at the photodiode.

In the case of chemiluminescence, no excitation light source is needed for the photodiodes to detect emitted light. Instead, the biological sample may emit light due to a chemical or enzymatic reaction that may occur between the biological sample and the chemiluminescent dye (or other solution), causing light to be emitted due to breaking or forming chemical bonds (e.g., the action of a luciferase protein on a luciferin substrate).

For both fluorescence and chemiluminescence, the photodiodes may detect the intensity of the emitted light and transform it into an electronic signal based on the intensity of the light that may be provided to an external device via metal wiring. The external device may correlate the electronic signal to a particular wavelength and brightness, based on the electronic signal.

In some embodiments, the active spot or well on the surface of the biosensor and the nucleic acid macromolecule may be mutually configured such that each spot binds only one nucleic acid macromolecule. This may be achieved, for example, by contacting the surface with amplicons that correspond in size to the active spot (e.g., an amplicon having a diameter that is effectively as large or larger than the diameter of the active spot). See U.S. Pat. No. 8,445,194, herein incorporated by reference in its entirety. Alternatively, the active spot can be chemically adapted to bind a single DNA fragment, which may then be amplified to fill a larger region at and around the original binding site.

Some embodiments of the invention may be used to determine different labels corresponding to different wavelengths of light. The labels may be, for example, fluorescent, chemiluminescent or bioluminescent labels. For example, in gene sequencing (or DNA sequencing), embodiments of the invention may be used to determine the precise order of nucleotide bases within a nucleic acid macromolecule (e.g., a strand of DNA). The nucleotide bases (e.g., adenine (A), guanine (G), cytosine (C), or thymine (T)) may be labeled with a specific fluorescent label. Alternatively, one color, two color, or three color sequencing methods, for example, may be used.

With respect to fluorescence, each of the nucleotide bases may be determined in order by successively exciting the nucleic acid macromolecule with excitation light. The nucleic acid macromolecule may absorb the excitation light and transmit an emitted light of a different wavelength onto a biosensor as described herein. The biosensor may measure the wavelength of emitted light and intensity received by the photodiode. Each nucleotide (e.g., fluorescently labeled nucleotide), when excited by excitation light of a certain wavelength and/or intensity, may emit a certain wavelength of light and/or intensity into the photodiode, allowing identification of the presence of a particular nucleotide base at a particular position in the nucleic acid macromolecule. Once that particular nucleotide base has been determined, it may be removed from the nucleic acid macromolecule, such that the next successive nucleotide base may be determined according to a similar process.

A nucleic acid macromolecule may be labeled with one or more different fluorescent, chemiluminescent, or bioluminescent labels before or after attaching to the biosensor for any purpose. For example, the nucleic acid macromolecule may be hybridized with a labeled oligonucleotide probe or amplification primer. Alternatively, the nucleic acid macromolecule may be hybridized with a non-labeled oligonucleotide, which may then be ligated to a labeled probe, or extended using labeled nucleotide analogs. By way of illustration, the labeling may be done for the purpose of characterizing the nucleic acid macromolecule (for example, the presence of a single nucleotide polymorphism (SNP) associated with a disease), or for nucleic acid sequencing of all or a part of the nucleic acid macromolecule, as described above. DNA sequencing by probe hybridization is described, for example, in U.S. Pat. No. 8,105,771, herein incorporated by reference in its entirety. Sequencing by anchor probe ligation is described, for example, in U.S. Pat. No. 8,592,150, herein incorporated by reference in its entirety. Sequencing by synthesis is described, for example, in U.S. Pat. No. 7,883,869, herein incorporated by reference in its entirety. In general, sequencing by synthesis is a method in which nucleotides are added successively to a free 3' hydroxyl group provided by a sequencing primer hybridized to a template sequence, resulting in synthesis of a nucleic acid chain in the 5' to 3' direction. In one approach, another exemplary type of SBS, pyrosequencing techniques may be employed (Ronaghi et al., 1998, *Science* 281:363).

In some embodiments, the biosensor may be reversibly coupled to a flow cell (not shown). The nucleic acid macromolecule may be attached to the biosensor by contacting the biosensor with a liquid sample in the flow cell. The flow cell may include one or more flow channels that are in fluid communication with the reaction sites. In one example, the biosensor may be fluidically and electrically coupled to a bioassay system. The bioassay system may deliver reagents to the reaction sites according to a predetermined protocol and perform imaging events. For example, the bioassay system may direct solutions to flow along the reaction sites. The solution may include four types of nucleotides having the same or different fluorescent labels. In some embodiments, the bioassay system may then illuminate the reaction sites using an excitation light source. The excitation light may have a predetermined wavelength or wavelengths. The excited fluorescent labels may provide emission signals that may be detected by the photodiodes.

A user may prepare for sequencing by contacting a biosensor according to described embodiments with nucleic acid amplicons, or with a nucleic acid that is subsequently amplified, such that the nucleic acid macromolecule binds and is retained by the active spots or wells, and excess nucleic acid macromolecule may be washed away. The nucleic acid macromolecules may be contacted beforehand or in situ with a labeled reagent. The biosensor may then be operated as described herein to determine light emitted on or around nucleic acid macromolecules on the array. The light may be quantified, or it may be sufficient to determine in a binary fashion which of the nucleic acid macromolecules on the surface have been labeled with labels that emit at a particular wavelength. Different probes or different nucleic acid analogs may be used concurrently that have labels that emit light at different wavelengths, for example, to determine different bases at a particular position in the sequence, or to sequence multiple locations.

Although described herein with respect to a backside illumination CMOS sensor, it is contemplated that embodiments of the invention may be similarly applied to a frontside illumination CMOS sensor. Further, it is contemplated that embodiments of the invention may similarly apply to any suitable biosensor, such as those biosensors described in U.S. patent application Ser. No. 15/803,077, filed Nov. 3, 2017, which is herein incorporated by reference in its entirety.

The above description includes the methodologies, systems and/or structures and uses thereof in example aspects of the presently-described technology. Although various aspects of this technology have been described above with a certain degree of particularity, or with reference to one or more individual aspects, those skilled in the art could make numerous alterations to the disclosed aspects without departing from the spirit or scope of the technology hereof. Since many aspects can be made without departing from the spirit and scope of the presently described technology, the appropriate scope resides in the claims hereinafter appended. Other aspects are therefore contemplated. Furthermore, it should be understood that any operations may be performed in any order, unless explicitly claimed otherwise or a specific order is inherently necessitated by the claim language. It is intended that all matter contained in the above description and shown in the accompanying drawings shall be interpreted as illustrative only of particular aspects and are not limited to the embodiments shown. Unless otherwise clear from the context or expressly stated, any concentration values provided herein are generally given in terms of admixture values or percentages without regard to any conversion that occurs upon or following addition of the particular component of the mixture. To the extent not already expressly incorporated herein, all published references and patent documents referred to in this disclosure are incorporated herein by reference in their entirety for all purposes. Changes in detail or structure may be made without departing from the basic elements of the present technology as defined in the following claims.

What is claimed is:

1. An apparatus including multiple biological chips, comprising:
   a substrate;
   a first adhesive layer disposed on the substrate;
   a first biological chip and a second biological chip disposed on the first adhesive layer and attached to the substrate by the first adhesive layer, the first and second biological chips spaced apart by a gap; and
   a filler disposed between the first biological chip and the second biological chip, the filler spanning across the gap between the first and second biological chips;
   wherein the filler includes:
      a second adhesive layer disposed between a side surface of the first biological chip and a side surface of the second biological chip, the second adhesive layer spanning across the gap and attaching the first biological chip to the second biological chip; and
      a surface layer disposed over the second adhesive layer, wherein the surface layer has a hydrophobic surface that spans across the gap and is co-planar with a top surface of the first biological chip and a top surface of the second biological chip.

2. The apparatus of claim 1, wherein the surface layer in the filler comprises a mold release material, or a poly(p-xylylene) polymer.

3. The apparatus of claim 1, wherein the surface layer in the filler comprises a titanium material.

4. The apparatus of claim 1, wherein the first adhesive layer comprises a die attach adhesive or a die attach film (DAF).

5. The apparatus of claim 1, wherein the second adhesive layer comprises a portion of the first adhesive layer extending between the side surface of the first biological chip and the side surface of the second biological chip.

6. The apparatus of claim 1, further comprising an intermediate layer between the second adhesive layer and the surface layer.

7. The apparatus of claim 1, wherein the first biological chip is a biosensor chip, and the second biological chip is a fluidic droplets manipulating chip.

8. The apparatus of claim 1, wherein the first and second biological chips are biosensor chips.

9. The apparatus of claim 1, further comprising a microfluidic housing attached to the first biological chip, the second biological chip, and the substrate.

10. The apparatus of claim 1, wherein the first biological chip and the second biological chip are connected to the substrate by solder balls disposed at bottom surfaces of the first biological chip and the second biological chip.

11. An apparatus including multiple biological chips, comprising:
   a substrate;
   a first adhesive layer disposed on the substrate;
   a first biological chip and a second biological chip disposed on the first adhesive layer and attached to the substrate by the first adhesive layer;
   a filler disposed in a gap between the first biological chip and the second biological chip, the filler spanning across the gap between the first and second biological chips; and
   a microfluidic housing attached to the first biological chip, the second biological chip, and the substrate.

12. The apparatus of claim 11, wherein the filler is compatible with biological samples and reagents in the microfluidic housing.

13. The apparatus of claim 11, wherein the gap between sidewalls of first and second biological chips is less than 500 micrometers.

14. An apparatus, comprising:
   a printed circuit board (PCB) having a cavity, the PCB having a top surface and a bottom surface;
   a first biological chip disposed in the cavity, the first biological chip having a top surface and a bottom surface, the top surface of the biological chip is co-planar with the top surface of the PCB, the top surface of the biological chip and the top surface of the PCB spaced apart by a gap; and
   a first filler disposed in the gap between the biological chip and the PCB, the filler spanning across the gap between the biological chip and the PCB;
   wherein the first filler includes:
      an adhesive layer disposed between a side surface of the first biological chip and a side surface of the PCB, the adhesive layer spanning across the gap and attaching the biological chip to the PCB; and
      a surface layer disposed over the adhesive layer, wherein the surface layer has a hydrophobic surface that spans across the gap and is co-planar with a top surface of the first biological chip and a top surface of the PCB.

15. The apparatus of claim 14, wherein the surface layer in the first filler comprises a mold release material or a titanium material.

16. The apparatus of claim 14, wherein the cavity in the PCB extends partially through the PCB and exposes a surface of the PCB at a bottom of the cavity.

17. The apparatus of claim 14, wherein the cavity in the PCB is a through hole that extends from the top surface of the PCB to the bottom surface of the PCB, and a bottom surface of the first biological chip is electrically coupled to a bottom surface of the PCB by wire bonds.

18. The apparatus of claim 14, further comprising a second biological chip disposed in the cavity, the second biological chip having a top surface and a bottom surface, the top surface of the biological chip is co-planar with the top surface of the PCB; and
   a second filler disposed between the second biological chip and the PCB;
   wherein the second filler includes:
   an adhesive layer disposed between a side surface of the biological chip and a side surface of the PCB, the adhesive layer attaching the biological chip to the PCB; and
   a surface layer disposed over the adhesive layer, wherein the surface layer has a hydrophobic surface that is co-planar with a top surface of the second biological chip and a top surface of the PCB.

19. The apparatus of claim 18, further comprising a third filler disposed between the first biological chip and the second biological chip;
   wherein the third filler includes:
   an adhesive layer disposed between a side surface of the biological chip and a side surface of the PCB, the adhesive layer attaching the biological chip to the PCB; and
   a surface layer disposed over the adhesive layer, wherein the surface layer has a hydrophobic surface that is co-planar with a top surface of the first biological chip and a top surface of the second biological chip.

* * * * *